(12) United States Patent
Hasin et al.

(10) Patent No.: US 9,917,224 B2
(45) Date of Patent: Mar. 13, 2018

(54) PHOTOVOLTAIC MODULE ASSEMBLY

(71) Applicant: Essence Solar Solutions Ltd., Herzlia Pituach (IL)

(72) Inventors: Slava Hasin, Petach-Tikva (IL); Ron Helfan, Tel-Aviv (IL)

(73) Assignee: Essence Solar Solutions Ltd., Herzlia Pituach (IL)

( * ) Notice: Subject to any disclaimer, the term of this patent is extended or adjusted under 35 U.S.C. 154(b) by 0 days.

(21) Appl. No.: 13/904,251

(22) Filed: May 29, 2013

(65) Prior Publication Data

US 2013/0319507 A1 Dec. 5, 2013

Related U.S. Application Data

(60) Provisional application No. 61/652,332, filed on May 29, 2012.

(51) Int. Cl.
*H01L 31/042* (2014.01)
*H01L 31/052* (2014.01)
(Continued)

(52) U.S. Cl.
CPC .............. *H01L 31/052* (2013.01); *B32B 3/06* (2013.01); *B32B 7/12* (2013.01); *H01L 21/683* (2013.01);
(Continued)

(58) Field of Classification Search
CPC .................................................... H01L 31/024
See application file for complete search history.

(56) References Cited

U.S. PATENT DOCUMENTS 3,574,333 A 4/1971 Ohara
4,387,413 A * 6/1983 Griffis ............... H01L 23/3121
174/16.3
(Continued)

FOREIGN PATENT DOCUMENTS

EP 0971569 1/2000
EP 1026927 8/2000
(Continued)

OTHER PUBLICATIONS

Azur Space "Enhanced Fresnel Assembly—EFA. Cell Type: Concentrator Triple Junction Solar Cell—3C40A. Application: Concentrating Photovoltaic COC Assembly. Board Size: 19,6 x 18,0 mm", Azur Space Solar Power GmbH, 4 P., 2010.

(Continued)

*Primary Examiner* — Uyen M Tran

(57) ABSTRACT

A concentrated photovoltaic receiver and backplane assembly is described herein. A thermally conductive heat spreader is configured between the receiver and the backplane for dissipating at least a portion of the thermal energy in a direction including a horizontal component towards a portion of the heat spreader which is not directly in contact with a receiver portion. In some embodiments, the heat spreader is electrically conductive and is adapted for conducting current from the receiver to the backplane. In some embodiments, a surface area of a receiver substrate is less than 5 times larger than a surface area of a solar cell that is mounted onto the receiver substrate. In some embodiments, the receiver substrate comprises vias for conducting current from a top face to a bottom face of the receiver.

16 Claims, 16 Drawing Sheets
(8 of 16 Drawing Sheet(s) Filed in Color)

(51) Int. Cl.

| | | |
|---|---|---|
| H01L 31/18 | (2006.01) | |
| H01L 21/683 | (2006.01) | |
| H01L 31/0232 | (2014.01) | |
| H01L 33/58 | (2010.01) | |
| B32B 3/06 | (2006.01) | |
| B32B 7/12 | (2006.01) | |
| H05K 13/04 | (2006.01) | |
| H01L 31/02 | (2006.01) | |
| H01L 31/054 | (2014.01) | |
| H05K 1/02 | (2006.01) | |
| H05K 1/05 | (2006.01) | |

(52) U.S. Cl.
CPC .... *H01L 31/02008* (2013.01); *H01L 31/0232* (2013.01); *H01L 31/0543* (2014.12); *H01L 31/18* (2013.01); *H01L 33/58* (2013.01); *H05K 1/0203* (2013.01); *H05K 13/0465* (2013.01); *H01L 2224/48091* (2013.01); *H01L 2224/73265* (2013.01); *H05K 1/05* (2013.01); *H05K 2201/10143* (2013.01); *Y02E 10/52* (2013.01); *Y10T 29/5313* (2015.01); *Y10T 428/12382* (2015.01)

(56) References Cited

U.S. PATENT DOCUMENTS

| | | | |
|---|---|---|---|
| 4,836,861 A * | 6/1989 | Peltzer | H01L 31/02008 136/244 |
| 5,053,850 A | 10/1991 | Baker et al. | |
| 5,118,361 A * | 6/1992 | Fraas | H01L 31/05 136/244 |
| 5,357,060 A | 10/1994 | Yamashita | |
| 5,453,581 A | 9/1995 | Liebman et al. | |
| 5,498,297 A | 3/1996 | O'Neill et al. | |
| 5,579,206 A * | 11/1996 | McLellan | G04G 17/02 174/260 |
| 5,859,474 A | 1/1999 | Dordi | |
| 5,872,399 A | 2/1999 | Lee | |
| 6,069,323 A | 5/2000 | Slupek et al. | |
| 6,087,596 A | 7/2000 | Liu | |
| 6,115,262 A | 9/2000 | Brunner et al. | |
| 6,147,410 A | 11/2000 | Elliott et al. | |
| 6,201,305 B1 | 3/2001 | Darveaux et al. | |
| 6,316,736 B1 | 11/2001 | Jairazbhoy et al. | |
| 6,853,091 B2 | 2/2005 | Miyajima | |
| 6,921,018 B2 | 7/2005 | Ference et al. | |
| 6,969,808 B2 | 11/2005 | Shiraki et al. | |
| 7,005,750 B2 | 2/2006 | Liu | |
| 7,042,098 B2 | 5/2006 | Harun et al. | |
| 7,064,449 B2 | 6/2006 | Lin et al. | |
| 7,115,819 B1 | 10/2006 | Rumsey | |
| 7,170,151 B2 | 1/2007 | Elpedes et al. | |
| 7,224,073 B2 | 5/2007 | Kim | |
| 7,276,793 B2 | 10/2007 | Sakamoto et al. | |
| 7,658,071 B1 | 2/2010 | McDermott | |
| 7,723,855 B2 | 5/2010 | Tsai et al. | |
| 7,911,056 B2 | 3/2011 | Liu et al. | |
| 7,972,875 B2 | 7/2011 | Rogers et al. | |
| 7,977,567 B2 * | 7/2011 | Bett et al. | 136/244 |
| 8,026,440 B1 | 9/2011 | Gordon | |
| 8,093,492 B2 | 1/2012 | Hering et al. | |
| 8,128,852 B2 | 3/2012 | Shin et al. | |
| 8,153,886 B1 * | 4/2012 | Garboushian et al. | 136/246 |
| 8,242,350 B2 | 8/2012 | Cashion et al. | |
| 8,261,660 B2 | 9/2012 | Menard | |
| 8,377,358 B2 | 2/2013 | Keenihan et al. | |
| 2002/0109970 A1 * | 8/2002 | Yang | H01L 23/3672 361/695 |
| 2003/0056975 A1 | 3/2003 | Kochanowski et al. | |
| 2003/0067264 A1 | 4/2003 | Takekuma | |
| 2003/0140962 A1 * | 7/2003 | Sharps et al. | 136/249 |
| 2005/0249463 A1 | 11/2005 | Wilson et al. | |
| 2005/0275079 A1 | 12/2005 | Stark | |
| 2007/0175655 A1 * | 8/2007 | Swanson et al. | 174/252 |
| 2008/0185034 A1 * | 8/2008 | Corio | 136/246 |
| 2008/0190478 A1 | 8/2008 | Lin | |
| 2008/0190480 A1 * | 8/2008 | Joshi | 136/246 |
| 2008/0316724 A1 | 12/2008 | Huang | |
| 2009/0026606 A1 * | 1/2009 | Chen | 257/712 |
| 2009/0101207 A1 | 4/2009 | Milbourne et al. | |
| 2009/0107541 A1 | 4/2009 | Linke et al. | |
| 2009/0114265 A1 | 5/2009 | Milbourne et al. | |
| 2009/0199890 A1 * | 8/2009 | Hering et al. | 136/246 |
| 2009/0266593 A1 | 10/2009 | Karrer | |
| 2009/0272427 A1 * | 11/2009 | Bett et al. | 136/249 |
| 2009/0302345 A1 * | 12/2009 | Chuang | H01L 33/641 257/99 |
| 2010/0012171 A1 | 1/2010 | Ammar | |
| 2010/0081229 A1 * | 4/2010 | Spare et al. | 438/67 |
| 2010/0163105 A1 | 7/2010 | Chuang et al. | |
| 2010/0236603 A1 | 9/2010 | Menard et al. | |
| 2010/0326492 A1 | 12/2010 | Tan et al. | |
| 2010/0326494 A1 | 12/2010 | Okamoto | |
| 2011/0108092 A1 | 5/2011 | Le Lievre et al. | |
| 2012/0115262 A1 | 5/2012 | Menard et al. | |
| 2012/0313241 A1 | 12/2012 | Bower | |
| 2012/0314388 A1 | 12/2012 | Bower et al. | |
| 2013/0112239 A1 | 5/2013 | Liptac et al. | |
| 2013/0320376 A1 | 12/2013 | Hasin et al. | |
| 2013/0323526 A1 | 12/2013 | Hasin et al. | |

FOREIGN PATENT DOCUMENTS

| | | |
|---|---|---|
| EP | 1959505 | 8/2008 |
| EP | 2254156 | 11/2010 |
| EP | 2312646 | 4/2011 |
| EP | 2482331 | 8/2012 |
| GB | 2313961 | 12/1997 |
| JP | 09-083018 | 3/1997 |
| WO | WO 91/18419 | 11/1991 |
| WO | WO 03/036689 | 5/2003 |
| WO | WO 2008/045187 | 4/2008 |
| WO | WO 2009/144715 | 12/2009 |
| WO | WO 2010/091391 | 8/2010 |
| WO | WO 2011/005486 | 1/2011 |
| WO | WO 2011/036323 | 3/2011 |
| WO | WO 2011/081090 | 7/2011 |
| WO | WO 013/179286 | 12/2013 |
| WO | WO 2013/179287 | 12/2013 |
| WO | WO 2013/179288 | 12/2013 |

OTHER PUBLICATIONS

Azur Space "Enhanced Fresnel Assembly—EFA. Cell Type: Concentrator Triple Junction Solar Cell—3C40A. Application: Concentrating Photovoltaic COC Assembly. Board Size: 32,0 x 37,0 mm", Azur Space Solar Power GmbH, 4 P., 2010.
Longford et al. "Smart Packages for CPV Cell Devices", Global Solar Technology, 3(5): 10-12, May 2010.
Maxwell "Surface Mount Zero Defect Design Check List", AVX Corporation, Technical Information, 8 P., Feb. 18, 2011.
Suncore "CTJ Receiver Assembly—5.5 mm x 5.5 mm", Datasheet, Suncore Photovoltaic Technology Co. Ltd., 1 P., Sep. 2012.
Telecontrolli "A New Phototvoltaic Receiver With Highest Performance and Multiplication Factor", Telecontrolli and System Design R&D, 1 P., 2012.
Corrected Notice of Allowability dated Oct. 30, 2014 From the US Patent and Trademark Office Re. U.S. Appl. No. 13/904,205.
International Search Report and the Written Opinion dated Oct. 8, 2013 From the International Searching Authority Re. Application No. PCT/IL2013/050459.
Notice of Allowance dated Jul. 28, 2014 From the US Patent and Trademark Office Re. U.S. Appl. No. 13/904,205.
Invitation to Pay Additional Fees dated Jul. 31, 2013 From the International Searching Authority Re. Application No. PCT/IL2013/050459.
Official Action dated Apr. 11, 2014 From the US Patent and Trademark Office Re. U.S. Appl. No. 13/904,205.

(56) References Cited

OTHER PUBLICATIONS

Official Action dated Sep. 15, 2014 From the US Patent and Trademark Office Re. U.S. Appl. No. 13/904,221.
International Search Report and the Written Opinion dated Oct. 1, 2013 From the International Searching Authority Re. Application No. PCT/IL2013/050458.
International Search Report and the Written Opinion dated Oct. 2, 2013 From the International Searching Authority Re. Application No. PCT/IL2013/050460.
Official Action dated May 8, 2014 From the US Patent and Trademark Office Re. U.S. Appl. No. 13/904,221.
Restriction Official Action dated Dec. 23, 2013 From the US Patent and Trademark Office Re. U.S. Appl. No. 13/904,221.
Advisory Action Before the Filing of an Appeal Brief dated Jun. 25, 2015 From the US Patent and Trademark Office Re. U.S. Appl. No. 13/904,221.
Applicant-Initiated Interview Summary dated Jun. 3, 2015 From the US Patent and Trademark Office Re. U.S. Appl. No. 13/904,221.
Supplementary European Search Report and the European Search Opinion dated Jan. 5, 2016 From the European Patent Office Re. Application No. 13797339.2.
Official Action dated Feb. 24, 2015 From the US Patent and Trademark Office Re. U.S. Appl. No. 13/904,221.
Official Action dated Jan. 13, 2016 From the US Patent and Trademark Office Re. U.S. Appl. No. 13/904,221.
Official Action dated May 19, 2016 From the US Patent and Trademark Office Re. U.S. Appl. No. 13/904,221.
Supplementary European Search Report and the European Search Opinion dated Jan. 18, 2016 From the European Patent Office Re. Application No. 13796763.4.
Supplementary European Search Report and the European Search Opinion dated Mar. 8, 2016 From the European Patent Office Re. Application No. 13797461.4.
Communication Pursuant to Article 94(3) EPC dated Jan. 24, 2017 From the European Patent Office Re. Application No. 13797461.4. (5 Pages).
Communication Pursuant to Article 94(3) EPC dated Dec. 13, 2016 From the European Patent Office Re. Application No. 13796763.4. (6 Pages).
Official Action dated Nov. 21, 2016 From the US Patent and Trademark Office Re. U.S. Appl. No. 13/904,221. (15 pages).
Communication Pursuant to Article 94(3) EPC dated Nov. 14, 2016 From the European Patent Office Re. Application No. 13797339.2. (6 Pages).
International Preliminary Report on Patentability dated Dec. 11, 2014 From the International Bureau of WIPO Re. Application No. PCT/IL2013/050458.
International Preliminary Report on Patentability dated Dec. 11, 2014 From the International Bureau of WIPO Re. Application No. PCT/IL2013/050459.
International Preliminary Report on Patentability dated Dec. 11, 2014 From the International Bureau of WIPO Re. Application No. PCT/IL2013/050460.

* cited by examiner

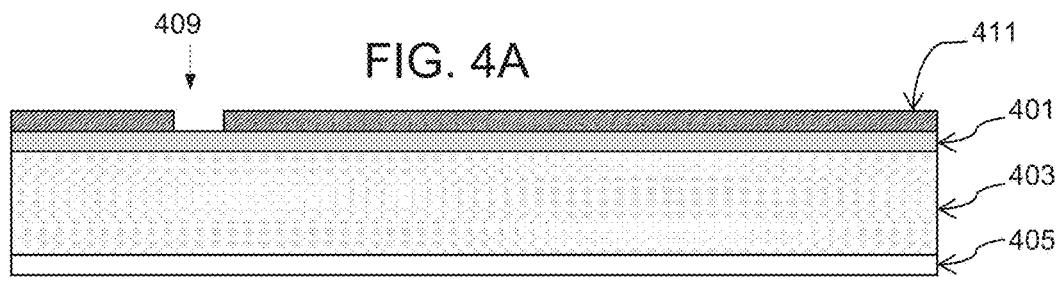
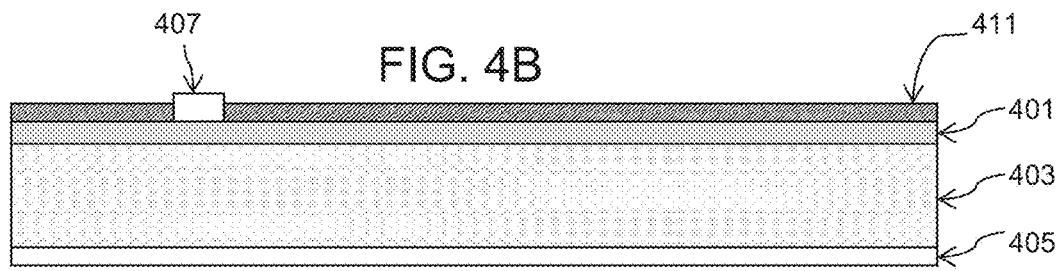
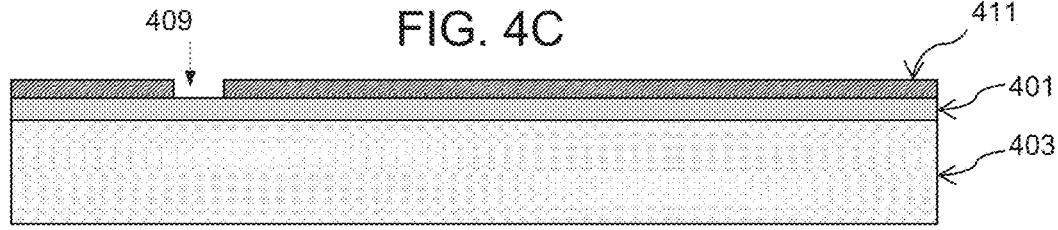
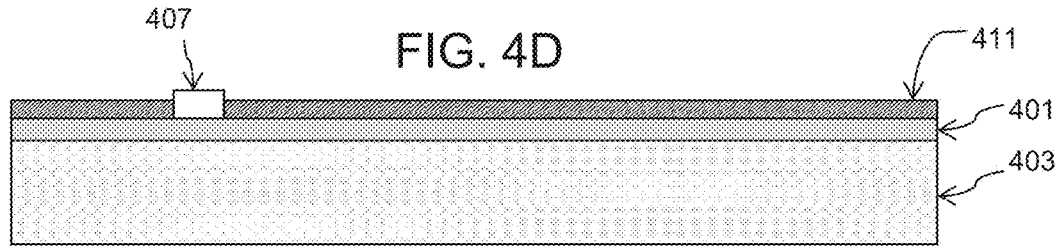

PHOTOVOLTAIC MODULE ASSEMBLY

RELATED APPLICATIONS

This application claims the benefit of priority under 35 USC § 119(e) of U.S. Provisional Patent Application No. 61/652,332 filed May 29, 2012, the contents of which are incorporated herein by reference in their entirety.

This application is also related to co-filed, and co-assigned U.S. and PCT Patent Applications entitled "FRAME HOLDER" Ser. Nos. 13/904,205, 12/167,689 by Slava Hasin and Ron Helfan, the disclosures of which are incorporated herein by reference.

This application is also related to co-filed, and co-assigned U.S. and PCT Patent Applications entitled "SELF ALIGNING SOLDERING" Ser. Nos. 13/904,221, 08/786, 165 by Slava Hasin and Ron Helfan, the disclosures of which are incorporated herein by reference.

FIELD AND BACKGROUND OF THE INVENTION

The present invention, in some embodiments thereof, relates to a concentrated photovoltaic (CPV) module and, more particularly, but not exclusively, to a concentrated photovoltaic receiver and backplane assembly.

U.S. Pat. No. 8,026,440 to Gordon discloses a "Passively cooled, high concentration photovoltaic solar cell package", further disclosing that: "The solar cell modular unit has a minimal number of components each of which are easily manufactured and which also have a relatively economical cost. It has a laminar substrate having an electrically conductive layer on its top surface that includes the printed electrical circuit. The middle layer is heat conductive and not electrically conductive. The bottom layer is made of thermally conductive material. A solar cell is centrally mounted on the printed circuit board. A base assembly covers the solar cell and it has a vertical tunnel extending from its top surface to the solar cell. An elongated sun shield has an aperture in its top panel that aligns with the tunnel of the base assembly. The sun shield snap-locks onto the top of the base assembly. A secondary optical element telescopically mates with the aperture in the sun shield and the tunnel of the base assembly. A primary light ray refractive member is positioned at a predetermined spaced location above the SOE."

SUMMARY OF THE INVENTION

According to an aspect of some embodiments of the invention, there is provided a CPV receiver and backplane assembly including a backplane, at least one CPV receiver mounted onto the backplane, and at least one thermally conductive heat spreader positioned between the receiver and backplane, wherein the heat spreader is thick enough and wide enough for dissipating at least 50% of the thermal energy conducted from the CPV receiver in a direction including a horizontal component, towards a portion of the heat spreader which is not directly in contact with a CPV receiver portion. In some embodiments, the heat spreader comprises a flat surface which is mounted to a surface of the backplane. In some embodiments, a thickness of the heat spreader is between 0.1-10 mm. In some embodiments, the assembly comprises at least three soldered interfaces for spreading and dissipating thermal energy, including an interface between the solar cell and the receiver substrate, an interface between the receiver substrate and the heat spreader, and an interface between the heat spreader and the backplane. In some embodiments, heat dissipation of the CPV receiver and backplane assembly is efficient enough for maintaining an operating temperature of a solar cell mounted on the receiver below 100° C. when the ambient temperature is 40° C., and the sunlight concentration is ×1000. In some embodiments, the backplane is constructed as a metal core printed circuit board (MCPCB). In some embodiments, a heat spreader is constructed as a metal core printed circuit board (MCPCB). In some embodiments, the heat spreader is a surface mount component suitable for assembly using pick and place machinery. In some embodiments, a substrate of the backplane is suitable for surface mount technology machinery use. In some embodiments, the backplane comprises at least one pad for mounting at least one of the heat spreaders and the CPV receiver onto the backplane, and the pad is thermally and electrically conductive, providing at least two electrical contacts. An exemplary size of the pad is at least 1 cm×1 cm.

According to an aspect of some embodiments of the invention, there is provided a backplane, at least one CPV receiver mounted on the backplane, and at least one thermally conductive heat spreader positioned between the receiver and backplane, wherein the heat spreader is electrically conductive for conducting current from the receiver to the backplane. In some embodiments, the receiver comprises at least two outputs with different electrical potentials; wherein one output is connected to a first heat spreader, and a second output is connected to a second heat spreader; and wherein the first and second heat spreaders comprise an electrically isolating region between them. In some embodiments, the isolating region is an air gap having a width ranging between 0.1-2 mm. In some embodiments, the isolating region is filled with a dielectric material molding. In some embodiments, the backplane is constructed as a metal core printed circuit board (MCPCB). In some embodiments, the heat spreader is a surface mount component suitable for assembly using pick and place machinery.

According to an aspect of some embodiments of the invention, there is provided a CPV receiver comprising a solar cell mounted on a substrate, wherein a surface area of the substrate is less than 5 times larger than a surface area of the solar cell.

According to an aspect of some embodiments of the invention, there is provided a CPV receiver comprising a solar cell mounted on a substrate, wherein the substrate comprises one or more vias for conducting current from a top face of the substrate to a bottom face of the substrate. In some embodiments, the CPV receiver comprises two contact pads mounted on a bottom surface of the receiver, a first contact pad being an anode interface, and a second contact pad being a cathode interface. In some embodiments, the CPV receiver is a surface mount component suitable for assembly using pick and place machinery. In some embodiments, electrical connecting pads are configured only on the top and bottom surfaces of the receiver substrate. In some embodiments, the receiver substrate comprises a circumferential pad for mounting a lens holding frame.

According to an aspect of some embodiments of the invention, there is provided a CPV receiver and backplane assembly, comprising electronic components for processing electrical current generated by the receiver; wherein the electronic components are configured within or on the backplane, and wherein the receiver comprises one or more vias for conducting current from a top face of the receiver towards the backplane. In some embodiments, two adjacent heat spreaders are configured between the receiver and backplane, and the receiver comprises a lens affixed by a lens holding frame. In some embodiments, a ratio between the assembly's weight and the rated power of the assembly is 0.01 Kg/Watt.

According to an aspect of some embodiments of the invention, there is provided a method for soldering at least three components using a double reflow process, comprising soldering a first component onto a second component in a first reflow process, and soldering a third component onto the previously soldered first and second components in a second reflow process having a temperature profile that prevents re-melting of a bonding between the first component and second component. In some embodiments, the first component is selected from at least a solar cell, a CPV receiver substrate, and a heat spreader; the second component is selected from at least a CPV receiver substrate, a heat spreader, and a backplane; and the third component is selected from at least a heat spreader and a backplane. In some embodiments, the method further comprises soldering a solar cell onto a substrate of the receiver, soldering a thermally conductive heat spreader onto a top face of the backplane, and soldering the receiver comprising a previously soldered solar cell mounted on its top surface onto a top face of the heat spreader. In some embodiments, the second reflow process further comprises applying a solder paste having a lower melting temperature than a solder paste used for the first reflow process.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is an illustration of a cross section of a CPV receiver, according to some embodiments of the invention;

FIG. 2 is an illustration of a front view of a CPV receiver, according to some embodiments of the invention;

Figure 3A:
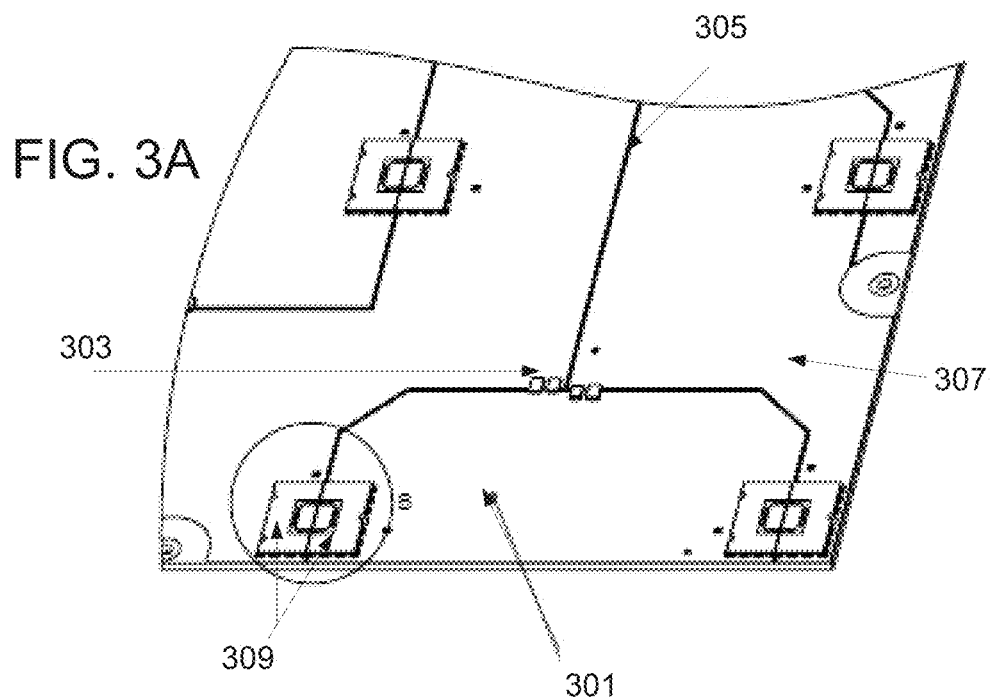
Figure 3B:
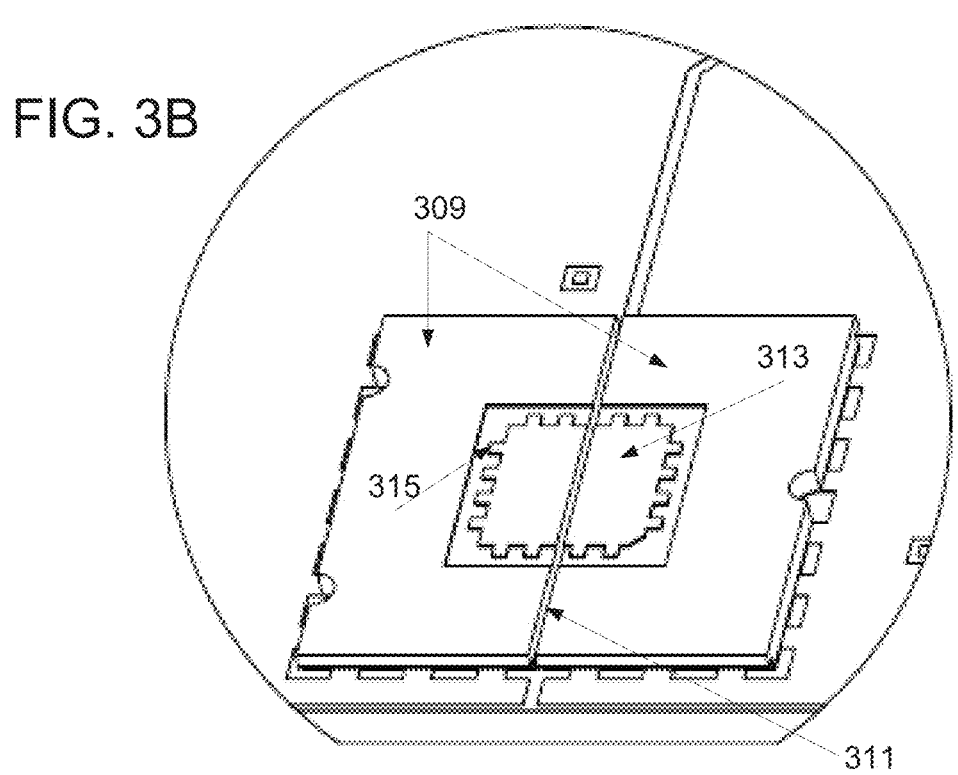
Figure 5A:
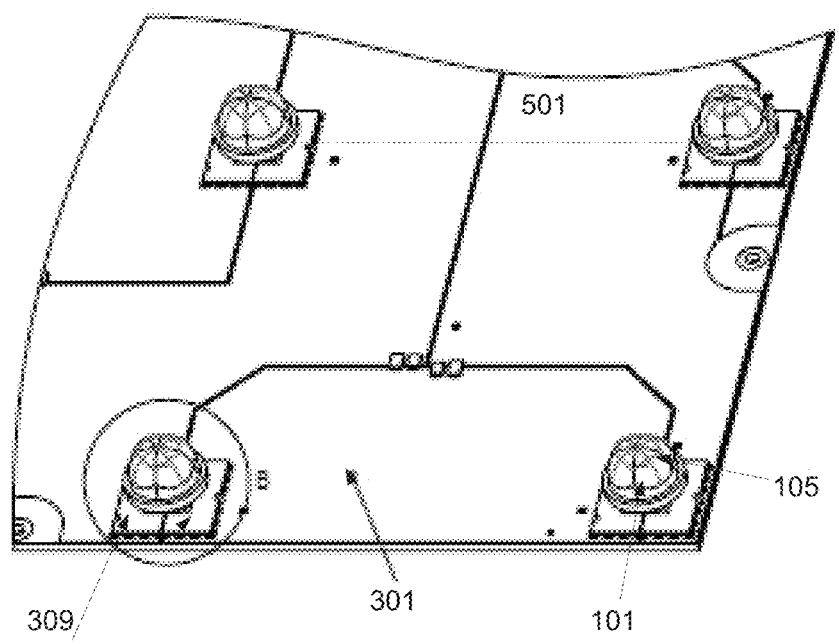
Figure 5B:
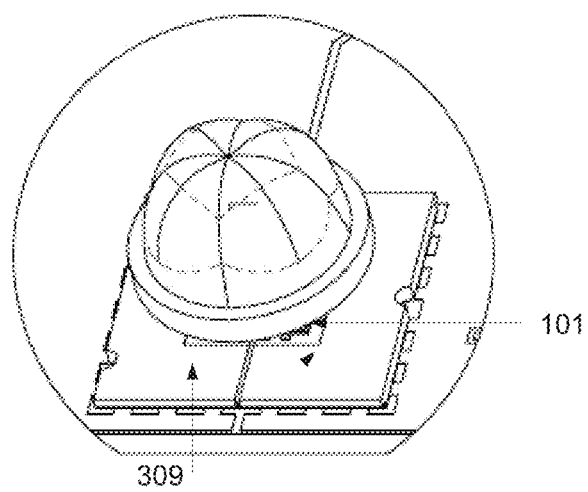
Figure 6A:
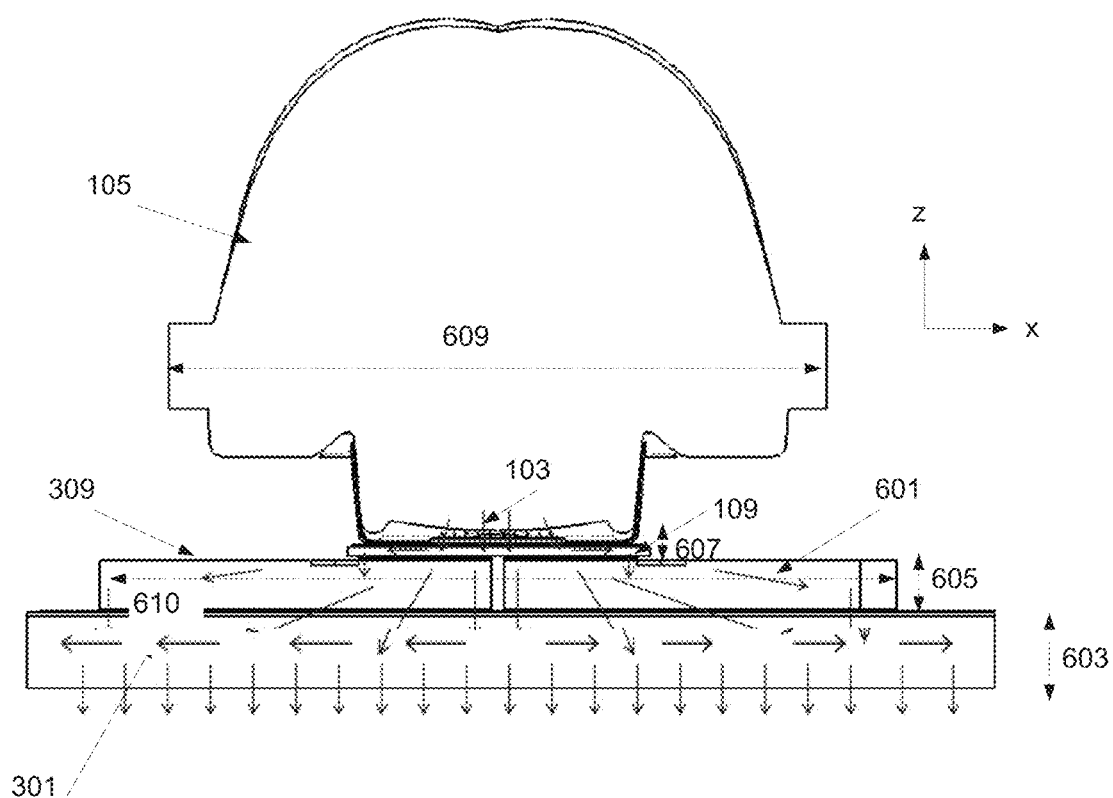
Figure 6B:
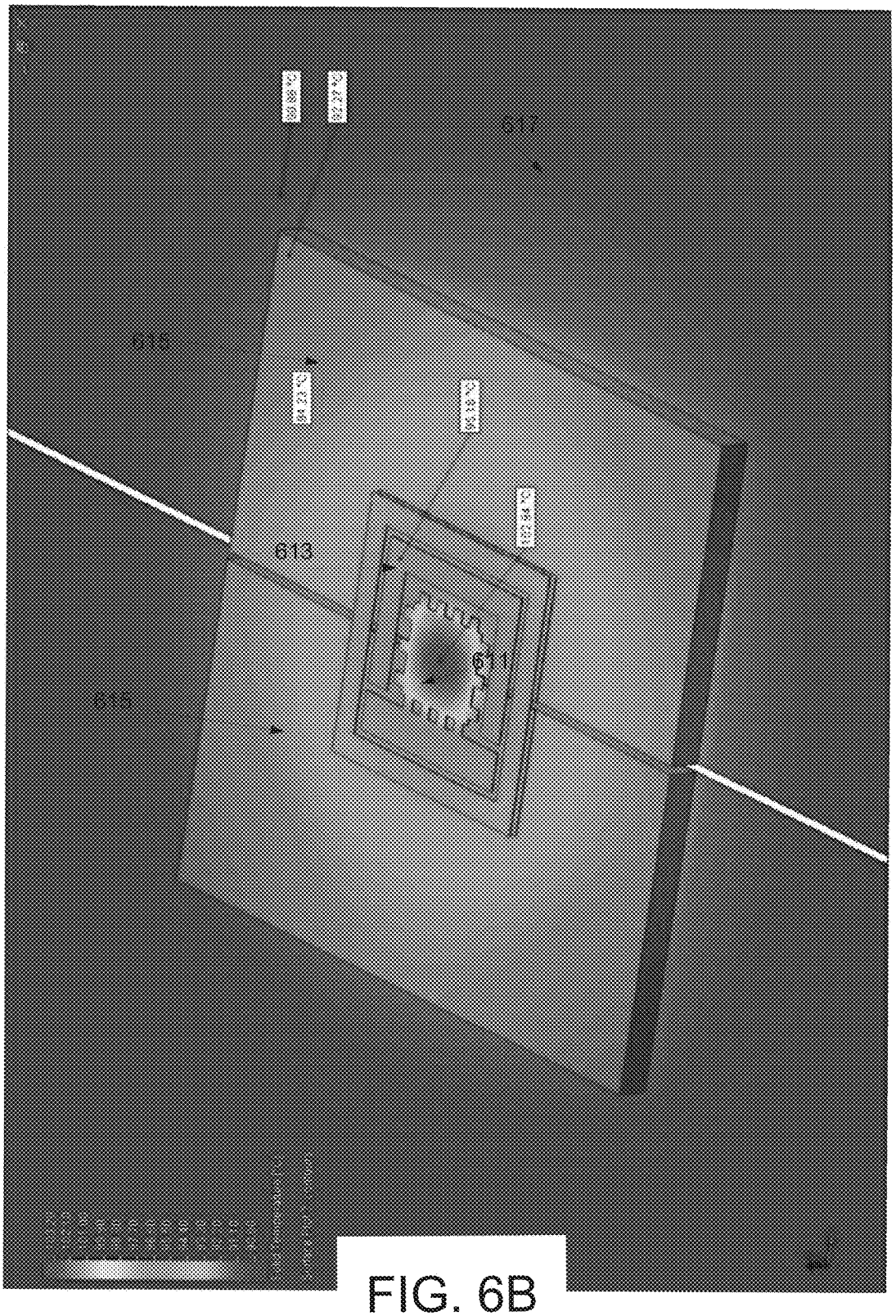
Figure 6C:
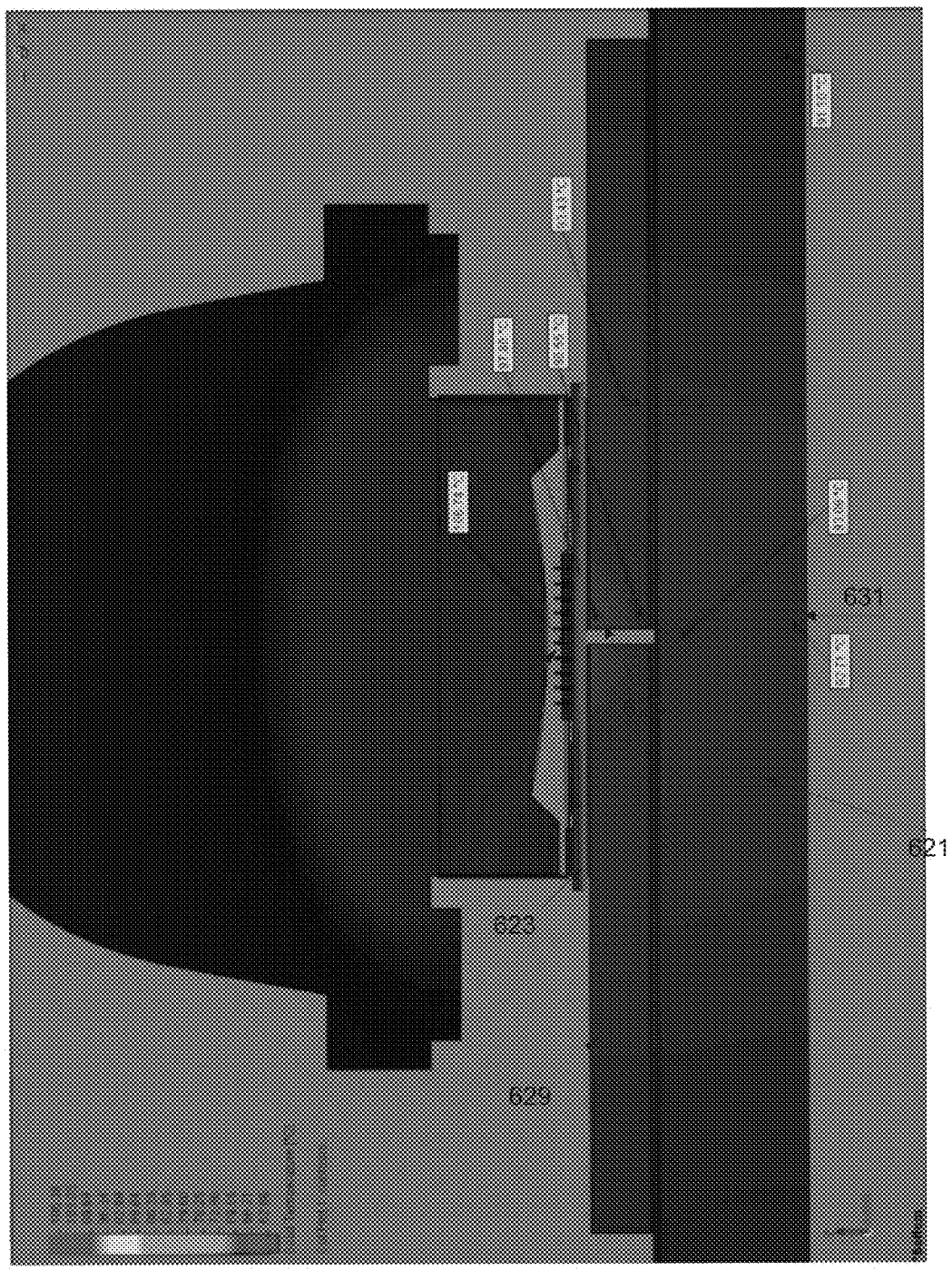
Figure 8:
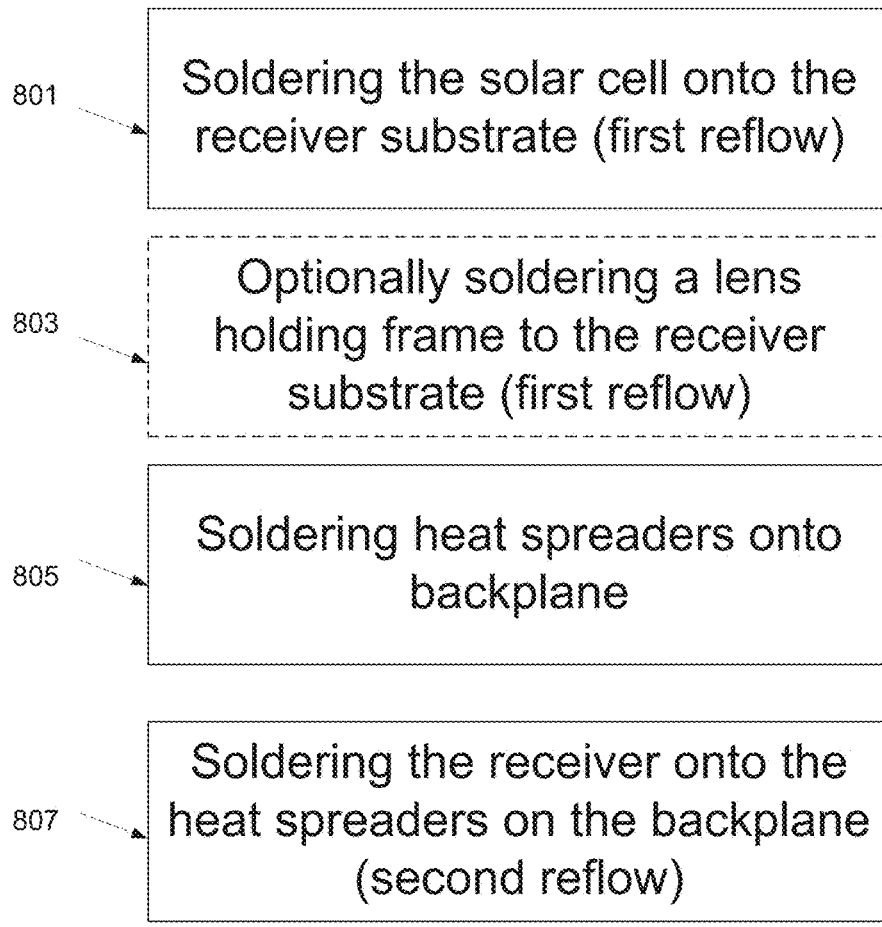
Figures 9A, 9B:
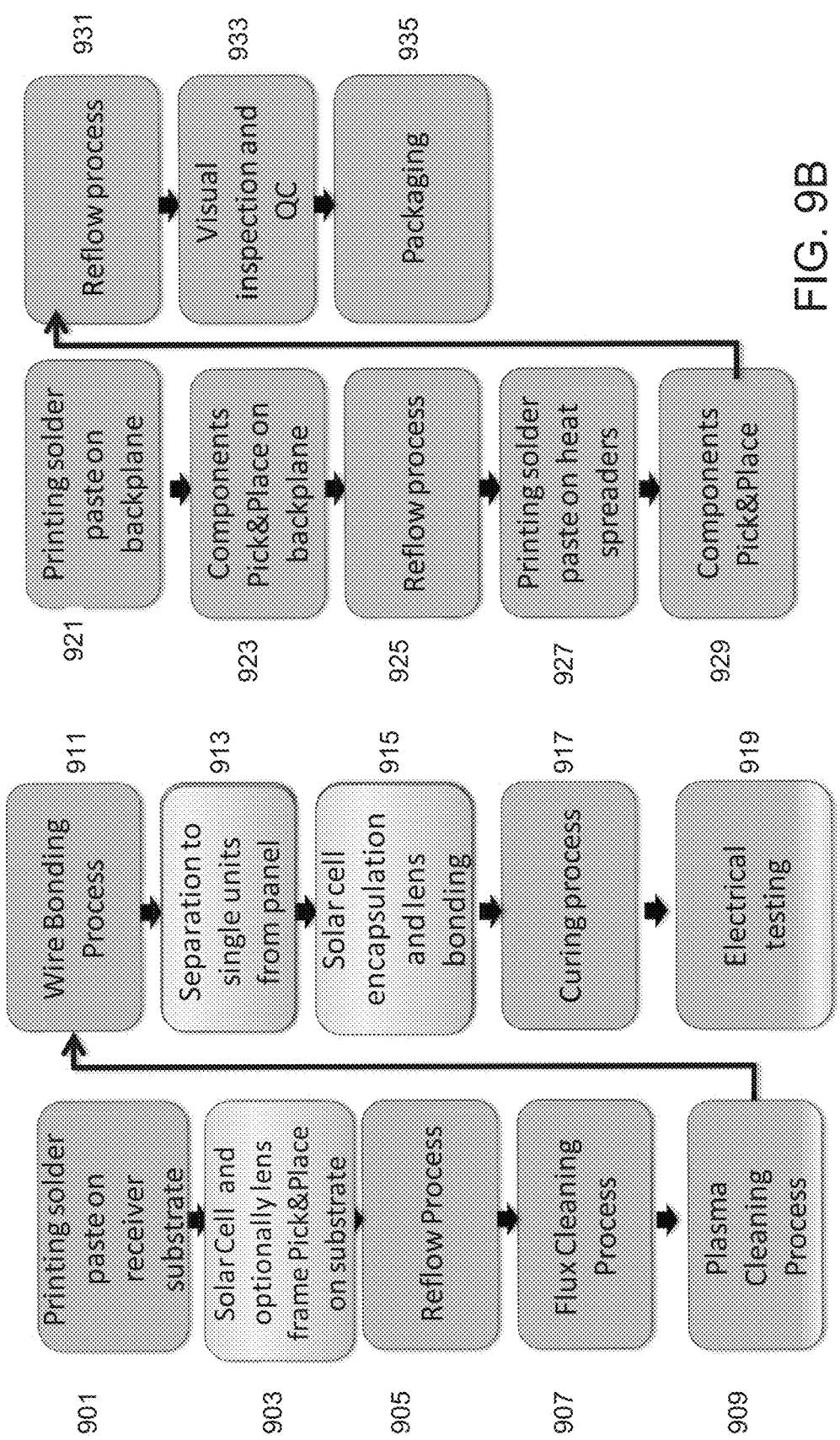
Figure 10A:
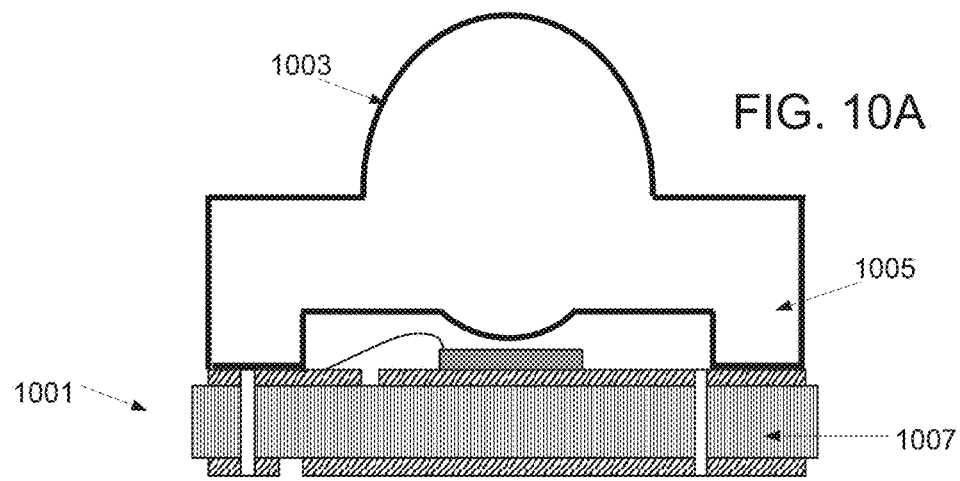
Figure 10B:
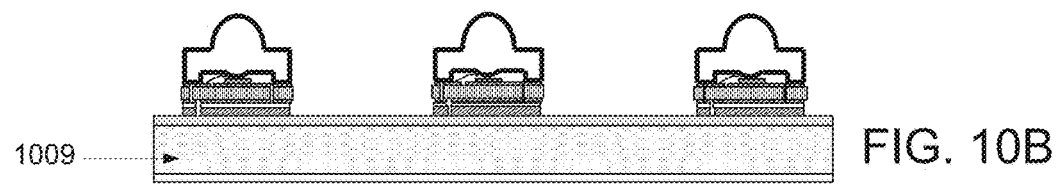
Figure 10C:
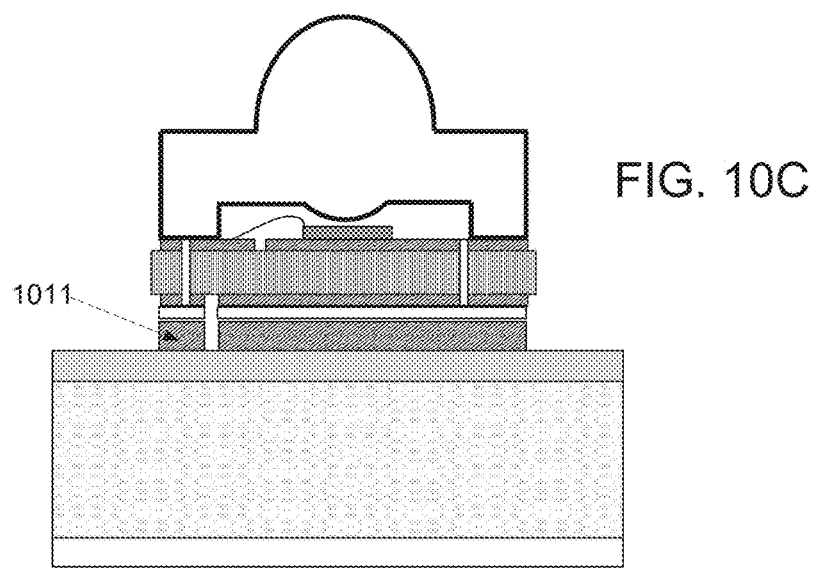
Figure 11A:
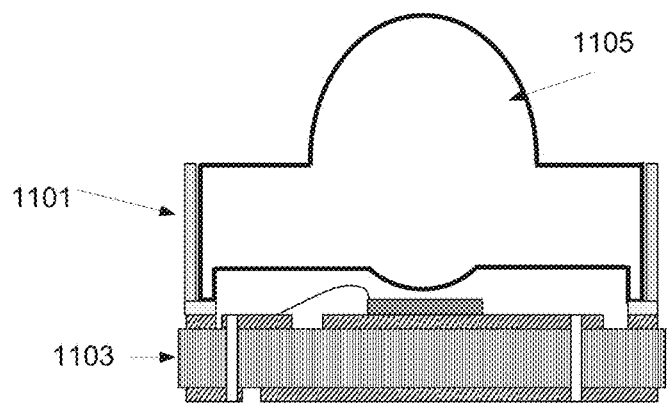
Figure 11B:
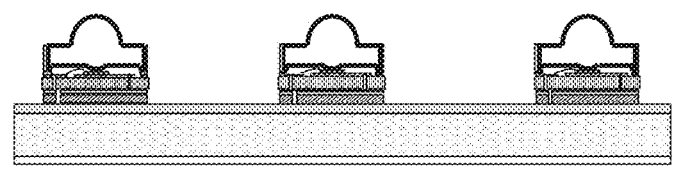
Figure 11C:
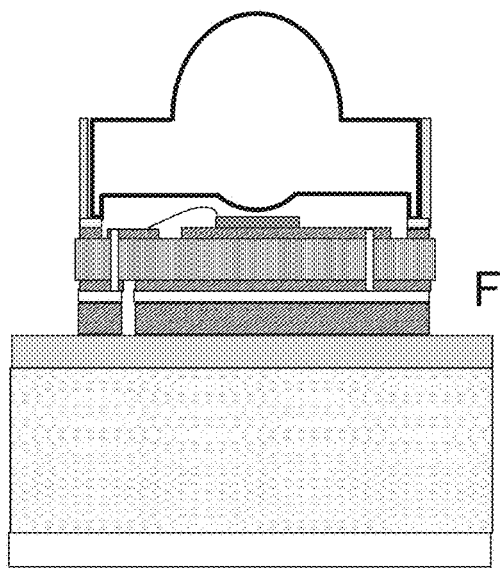
Figure 12A:
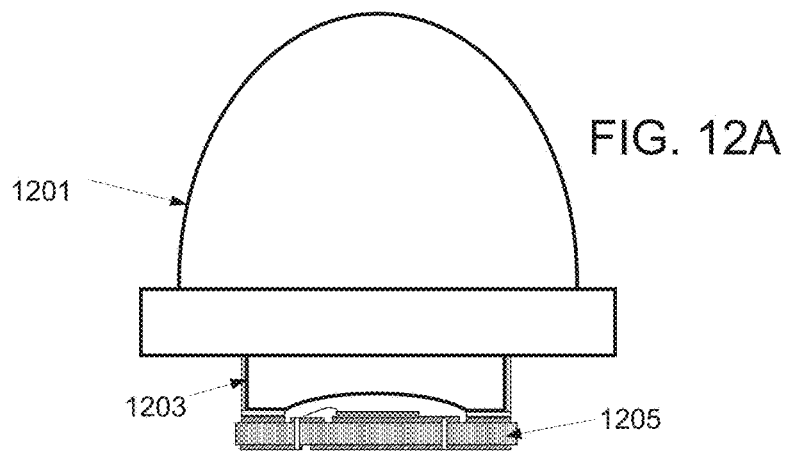
Figure 12B:
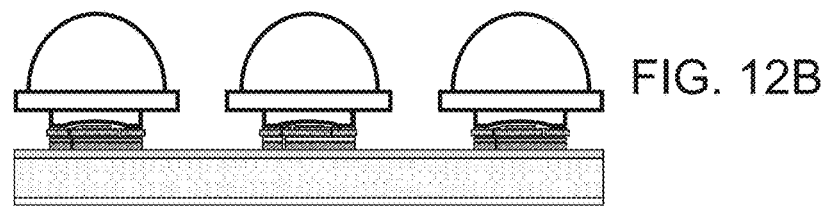
Figure 12C:
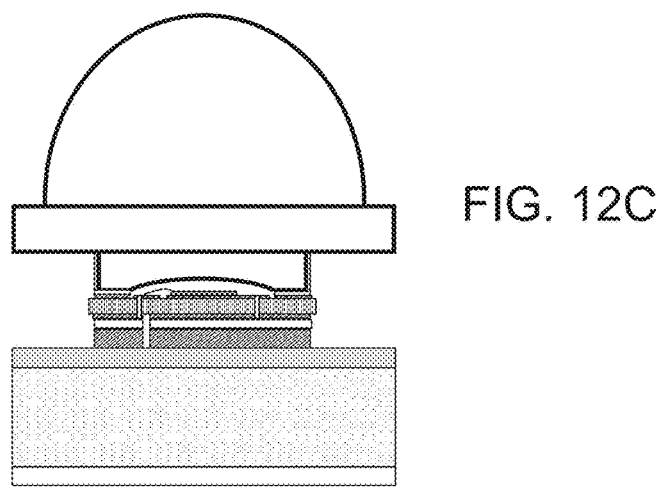
Figure 13A:
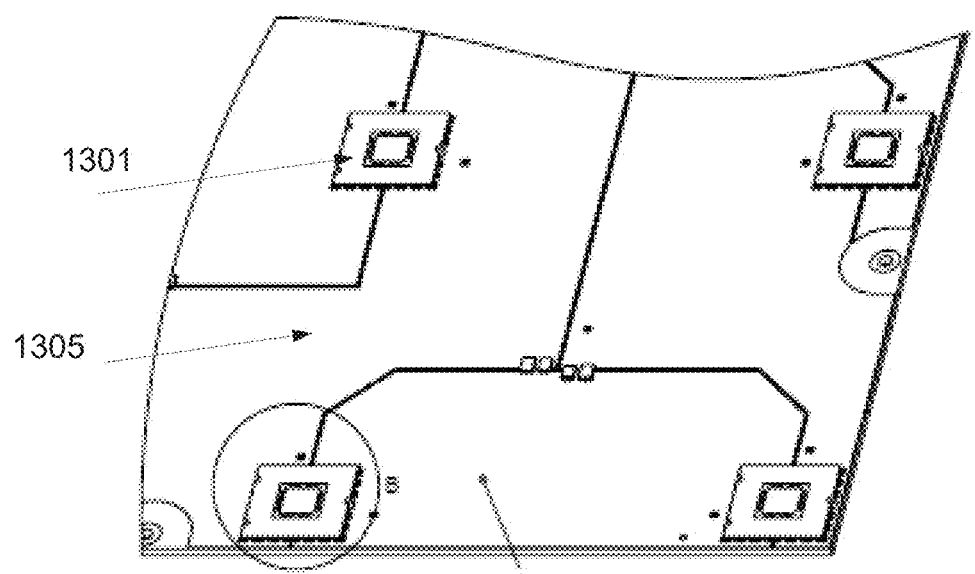
Figure 13B:
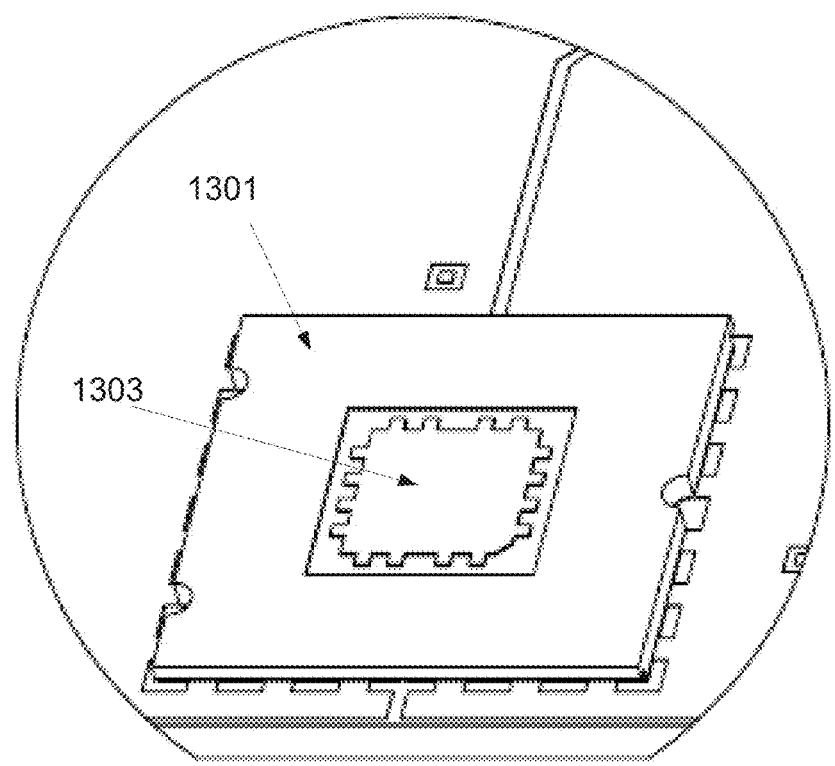
Figure 14A:
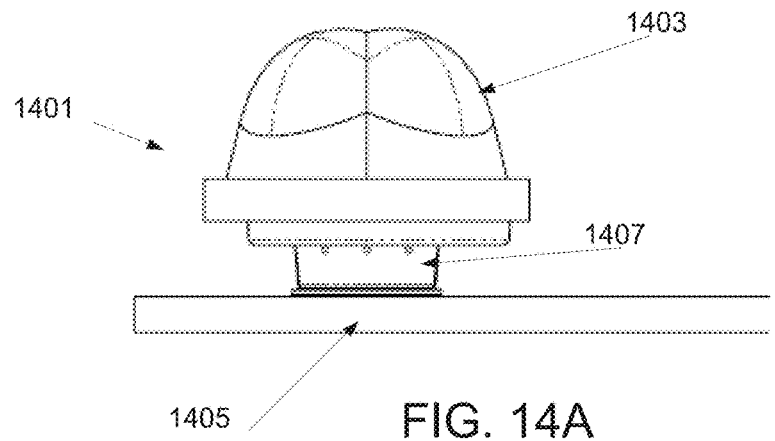
Figure 14B:
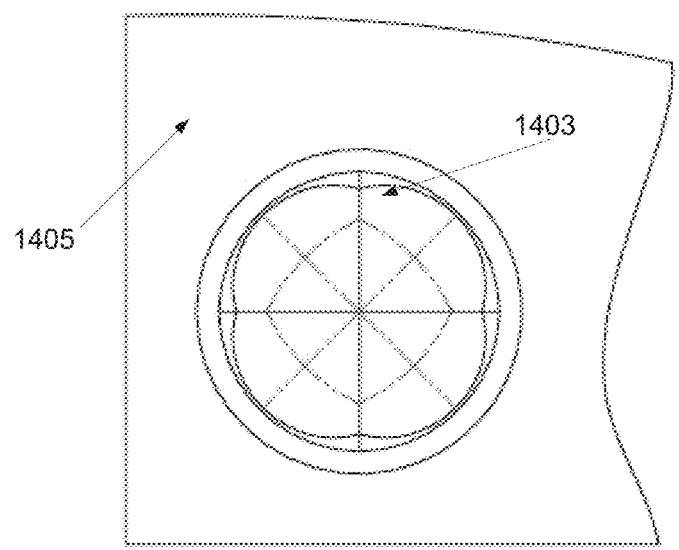

FIG. 3A-B illustrate an exemplary backplane structure, according to some embodiments of the invention;

FIG. 4A-D are illustrations of a cross section of four backplane layer structures, according to some embodiments of the invention;

FIG. 5A-B illustrate an exemplary assembled CPV receiver and backplane, according to some embodiments of the invention;

FIG. 6A-C are a schematic illustration of a funnel shaped heat dissipation pattern and exemplary results of a thermal analysis, according to some embodiments of the inventions;

FIG. 7A-D are illustrations of a pad used for attaching a receiver to one or more heat spreaders on a backplane, according to some embodiments of the invention;

FIG. 8 is a flowchart of a method for assembling a photovoltaic module using a double reflow process, according to some embodiments of the invention;

FIG. 9A-B are flowcharts of a manufacturing process of a receiver and backplane, according to some embodiments of the invention;

FIG. 10A-C illustrate a receiver and a corresponding backplane and receiver assembly, according to some embodiments of the invention;

FIG. 11A-C illustrate a receiver comprising a lens holding frame and a corresponding backplane and receiver assembly, according to some embodiments of the invention;

FIG. 12A-C illustrate another embodiment of a receiver comprising a lens holding frame and a corresponding backplane and receiver assembly, according to some embodiments of the invention;

FIG. 13A-B illustrate an embodiment of a heat spreader, according to some embodiments of the invention; and FIG. 14A-B illustrate a receiver mounted directly on a backplane, according to some embodiments of the invention.

DESCRIPTION OF SPECIFIC EMBODIMENTS OF THE INVENTION

The present invention, in some embodiments thereof, relates to a concentrated photovoltaic (CPV) module and, more particularly, but not exclusively, to a receiver and backplane assembly.

In some embodiments, the receiver comprises a solar cell mounted on a receiver substrate, and a secondary optical element, such as a lens, for concentrating and/or homogenizing sunlight onto the solar cell.

In some embodiments, one or more receivers are coupled to the backplane, in a series and/or parallel manner and/or combination thereof. In some embodiments, a primary optical element is positioned above a backplane populated with a plurality of receivers, to reflect sunlight onto the receivers. In some embodiments, each of the receivers comprises a secondary optical element, such a lens, for concentrating sunlight onto a solar cell of each receiver.

An aspect of some embodiments relates to controlling heat flow to reduce a temperature of, for example, the solar cell, and to increase dispersion of temperature throughout the receiver and backplane assembly. Some embodiments of the invention relate to a thermal structure of a CPV receiver and backplane assembly. In some embodiments, heat is dissipated through a plurality of layers of the module, for example conducted from a receiver substrate by heat spreading elements towards the backplane of the module. In some embodiments, components that are heat and/or light sensitive, such as electrical components, are configured only within the backplane, away from high temperature and/or high intensities of concentrated sunlight that may exist in the vicinity of the receiver.

An aspect of some embodiments of the invention relates to one or more thermally conductive heat spreaders that are mounted on a backplane. In some embodiments, a CPV receiver is positioned on one or more heat spreaders, such as two heat spreaders. In some embodiments, the heat spreaders are formed as sheets that are thick enough and/or wide enough to dissipate heat in a horizontal direction away from the receiver, providing a greater heat dissipating portion. In some embodiments, the heat spreaders are made of an electrically conductive material, and are used for conducting current from the receiver towards the backplane. In some embodiments, an isolating region such as an air gap and/or an insulation material is provided between two adjacent heat spreaders, for example to allow the heat spreaders to have different voltages. In some embodiments, a top surface of the heat spreaders is connected to electrical pads on a bottom face of the receiver substrate, and a bottom surface of the heat spreaders is connected to electrical pads on the backplane, to conduct current.

An aspect of some embodiments relates to a receiver structure in which a surface area of the receiver substrate is less than, for example, 4 times the surface area of the solar cell. As referred to herein, a solar cell includes an active surface, a pad, a busbar or any other form in which the photovoltaic effect takes place, and in which electrical current can be generated and collected via an interface. In some embodiments, a size of the receiver substrate surface area is reduced by using one or more vias passing vertically through the receiver substrate, to conduct current from a top face of the substrate to a bottom face of the substrate. In some embodiments, a size of the receiver substrate surface area is reduced by connecting electric components such as terminals and/or diodes on top and/or within the backplane substrate, as opposed to connecting them on the receiver substrate. In some embodiments, the receiver substrate comprises only a solar cell, and electric components for processing such as diodes are positioned on and/or within the backplane.

In some embodiments, a backplane comprises electric interfaces and/or wiring that are buried and/or routed within the backplane substrate. Optionally, this reduces an exposure of the interfaces and/or wiring to high temperature conditions and/or UV radiation and/or high intensities of concentrated sunlight (for example due to misalignment) which may be present in the vicinity of the receiver.

In some embodiments, the receiver and/or backplane are assembled using standard SMT processes and/or microelectronic assembly processes. In some embodiments, at least some of the processes are automated. Some of the components of the receiver and/or backplane may be assembled using electro-mechanic assembly methods.

An aspect of some embodiments relates to a method for assembling a CPV receiver and backplane module using a double reflow soldering process, in which components that were previously soldered go through a second reflow process for soldering one or more additional components. Optionally, a populated backplane comprising an array of receivers is assembled using the double reflow process. In some embodiments, the method comprises soldering a solar cell to the receiver substrate (and optionally soldering a lens holding frame to the receiver substrate), soldering heat spreaders to a backplane, and soldering the receiver to the backplane (for example to the heat spreaders) while the previously soldered receiver and solar cell go through a second reflow process. In some embodiments, conditions such as the temperature profile of the second reflow process and/or the selection of a solder paste according to its melting point are selected to maintain a bonding between the originally soldered components.

As referred to herein, a module includes a plurality of components that are connected by mechanical and/or electrical means, for example a module may include a CPV receiver, one or more heat spreaders, and at least a portion of a backplane. In some embodiments, the CPV receiver comprises a lens, a solar cell, receiver substrate, optionally one or more vias, optionally one or more electrical pads, optional wiring and optionally a lens holding frame. In some embodiments, a module may include additional and/or fewer and/or alternative components, for example a module may comprise a CPV receiver and a portion of the backplane only, and another module may comprise a CPV receiver, backplane, and heat spreaders configured between the receiver and backplane. Optionally, a module is constructed as a modular system, consisting of independent functional elements, or a non modular system, wherein components cannot be separated and/or recombined. In some embodiments, a module includes a CPV receiver and backplane assembly.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Description of an Exemplary CPV Receiver

Figure 1:
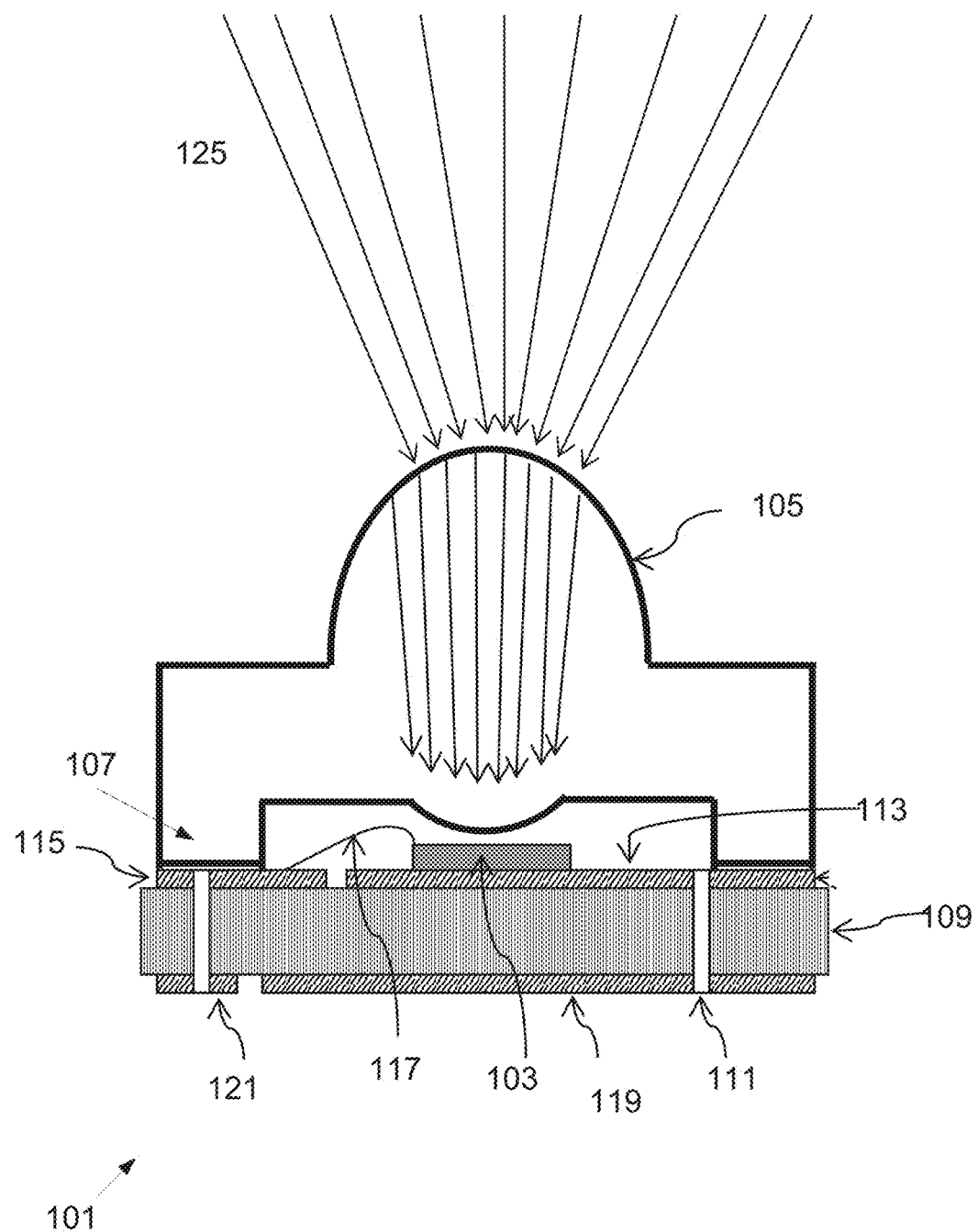

Referring now to the drawings, FIG. 1 illustrates an exemplary CPV receiver, according to some embodiments of the invention. Optionally, other receiver structures incorporating an equivalent heat dissipation mechanism and structure and/or electrical conduction design may be used.

In some embodiments, receiver 101 comprises a solar cell 103 mounted on a receiver substrate 109, a secondary optical element such as lens 105, one or more vias 111 passing vertically through substrate 109, electrical pads mounted on a top and bottom surfaces of receiver substrate 109 (113, 115, 119, 121 respectively), and wire bonding 117.

In some embodiments, receiver 101 comprises a solar cell 103. In some embodiments, solar cell 103 is configured for absorbing photons in sunlight 125 that hit the solar cell. Optionally, the absorbed photons cause electrons to be knocked-loose from their atoms, commonly known as the photovoltaic effect. Optionally, an electrical potential is formed, and current flows through the material. In some embodiments, the current is captured and collected.

In some embodiments, solar cell 103 comprises a photovoltaic material and/or structure. Optionally, a photovoltaic material includes, for example, a semi-conductive material, for example silicon. Other examples include GaAs cells, GalnP—GAlnAs—Ge cells, AlGalnP—Ga(ln)As—Ge cells, UMM cells, lattice-matched 3J-CPV cells, etc. In some embodiments, solar cell 103 comprises one or more layers of semi-conductive materials.

In some embodiments, a primary optical element (not shown in this figure) is positioned above a center solar cell 103, for example 220 mm above, to concentrate sunlight 125 onto the solar cell and/or onto a secondary optical element. In some embodiments, the primary optical element is a refractive element, such as a Fresnel lens. In some embodiments, the primary optical element is a reflective element, such as a mirror. In some embodiments, at least a portion of a backplane populated by a plurality of receivers is covered by the primary lens. Optionally, the primary lens is sealed on top of the populated backplane. Optionally, the sealing is hermetic.

In some embodiments, receiver 101 comprises a secondary optical element, such as lens 105. Optionally, lens 105 is used for concentrating sunlight 125 onto the solar cell. Optionally, lens 105 (together with the primary optical element) concentrates sunlight to intensities ranging between 500-1500 suns. In some embodiments, the primary optical element and/or lens 105 are configured for capturing sunlight at a wide acceptance angle, for example an acceptance angle of ±1°, ±1.1°, ±1.2°, ±1.5°, or intermediate, higher or lower values. Optionally, lens 105 is a beam shaping lens.

In some embodiments, lens 105 has one or more pedestals 107, such as legs, to be positioned, for example, on receiver substrate 109. In some embodiments, lens 105 is attached to receiver substrate 109 through a lens holding frame, as will be further shown. In some embodiments, a lumen between lens 105 and solar cell 103 is filled with air and/or silicon based encapsulation material.

Optionally, other primary and/or secondary elements known in the art can be used. Optionally, the structure and/or heat dissipation mechanism described herein allows for a higher concentration than known in the art, for example ×1500, therefore the primary and/or secondary optical elements may provide a higher concentration level.

The heat dissipation mechanism is described in the following. In some embodiments, substrate 109 is made of a material which can withstand high temperature conditions and concentrated sunlight, having a high thermal conductivity, for example 180 W/mk, to allow heat dissipation from solar cell 103, such as suitable ceramics, metal, glass, or silicon.

Optionally, in some embodiments, substrate 109 comprises one or more vias 111. Vias 111 enable a direct electrical connection to one or more heat spreaders (as will be further described), positioned below substrate 109. Optionally, the direct connection reduces and/or eliminates the need for electrical contacts. Optionally, current is delivered through vias 111, for example from a top face of substrate 109 to a bottom face of substrate 109. An exemplary intensity of current passing through multiple vias 111, for example 12 vias, ranges between 2.5-15 Amp. In some embodiments, a diameter of a via is, for example, 76 μm. Optionally, the current intensity depends on the cell size, the concentration ratio, and/or the optical efficiency of the module. In some embodiments, vias 111 are copper filled and/or copper plated.

Figure 2:
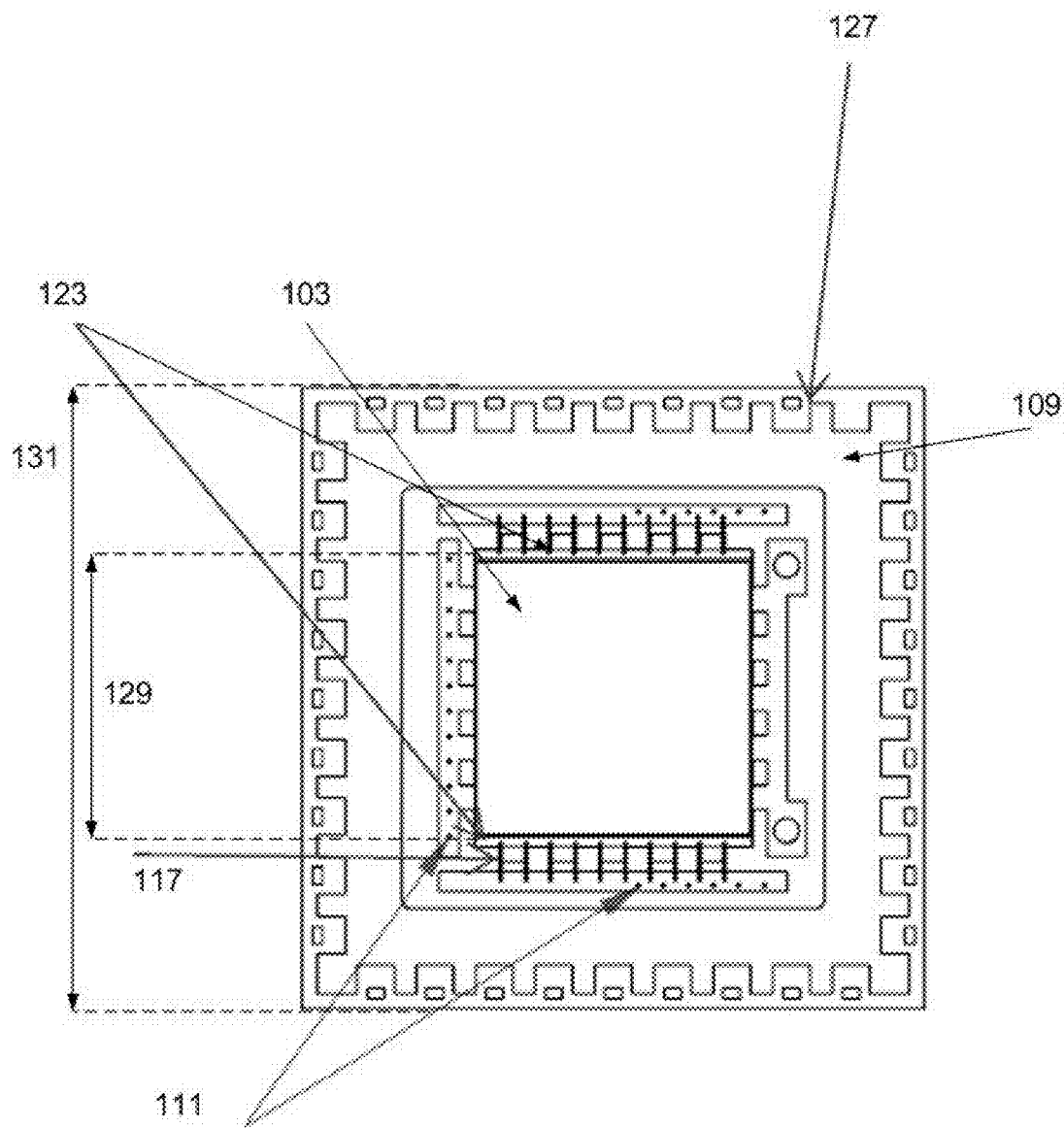

In some embodiments, a top face of substrate 109 comprises one or more electrical pads. In some embodiments, an electrical pad 113 is used for one polarity. Optionally, electrical pad 113 is connected to a bottom face of solar cell 103, which comprises the anode interface. In some embodiments, an electrical pad 115 is used for the opposite polarity. Optionally, electrical pad 115 is connected directly and/or indirectly to a top face of solar cell 103, which comprises the cathode interface. Optionally, busbars configured for example at the edges of the top face of solar cell 103 comprise the cathode interface, for example as shown in FIG. 2.

In some embodiments, one or more wire bonding 117 connect between the busbars at a top face of solar cell 103, for example to electrical pad 115. Additionally and/or alternatively, wedge bonding and/or tab bonding may be used to electrically connect between the busbars and pad 115.

In some embodiments, a bottom face of substrate 109 comprises or more electrical pads. In some embodiments, an electrical pad 119 is used for one polarity, and an electrical pad 121 is used for the opposite polarity. Optionally, current passes from the top electrical pads to the bottom electrical pads through vias 111.

In some embodiments, a top and/or bottom face of receiver substrate 109 is covered with a thermally and electrically conductive layer such as a copper layer, for example having a thickness ranging between 20-300 μm.

In some embodiments, materials comprising the receiver are selected such as to withstand high solar energy concentration levels, for example ranging between 500-1500 suns, high intensity UV radiation, for example withstanding an exposure to an accumulated amount of 50 kWh/m^2 (according to IEC 62108), and a wide operating temperature range and/or thermal cycles, for example an ambient temperature range between (−40)-(120)° C.

FIG. 2 is a front view of a CPV receiver, according to some embodiments of the invention (lens not shown in this figure).

In some embodiments, solar cell 103 is centered with respect to the outer boundaries of substrate 109. In other embodiments, solar cell 103 may be positioned at a different location, for example positioned at a corner of substrate 109, or along one of the edges.

In some embodiments, a size and/or shape of substrate 109 is determined according to a size of solar cell 103. In some embodiments, an optical aperture area of solar cell 103 ranges between, for example, 1-130 mm^2. Optionally, the surface area (optical aperture) of solar cell 103 is only slightly smaller than a surface area of substrate 109, so that the larger surface area of substrate 109 makes it easier to connect solar cell 103 on top of it. In some embodiments, a surface area of the receiver substrate is, for example, 2 times the surface area of a solar cell, 3 times, 4.6 times, or 5 times the area of a solar cell. Optionally, the surface area of the receiver substrate is identical to the surface area of the solar cell.

In some embodiments, a length of an edge 129 of solar cell 103 is smaller than a length of an edge 131 of substrate 109, for example by a factor of 2, 1.5, 1.2, or intermediate or larger factors. In one example, edge 131 of substrate 109 is 12.5 mm long, and edge 129 of solar cell 103 is 5.98 mm long. In this case, edge 131 of substrate 109 is 2.1 times as long as edge 129 of solar cell 103.

In some embodiments, a cathode interface of solar cell 103 is configured as busbars 123. Optionally, busbars 123 are positioned along one or more edges of solar cell 103, for example at the top face of the solar cell. In some embodiments, the busbars are plated with an electrically conductive material which is suitable for soldering such as aluminum, tin, copper, gold (gold Au), silver (silver Ag), or a combination thereof.

In some embodiments, an anode interface of solar cell 103 is configured at the rear back of the cell.

As previously described, current is delivered from the top electrical pads 113 and 115 (not shown in this figure) through vias 111 passing through substrate 119, for example from its top face to its bottom face, to connect to bottom electrical pads 119 and 121. A potential advantage of vias 111 may include eliminating the need for positioning electric terminals on the receiver, to deliver the opposite charges. Optionally, by not including electric terminals, the receiver can be manufactured with a smaller surface area, possibly reducing costs. Optionally, as the bottom surface of receiver substrate 109 comprises one or more pads, the CPV receiver is suitable for assembly using common SMT methods and/or machinery.

In some embodiments, the external edges of a top face of substrate 109 comprise a circumferential pad 127. Optionally, pad 127 is used for soldering a lens holding frame for affixing the lens onto the receiver.

Description of an Exemplary Backplane

FIGS. 3A-B show an exemplary structure of a backplane, according to some embodiments of the invention. In some embodiments, backplane 301 comprises circuitry to collect current generated by one or more receivers that are mounted on top of the backplane. In some embodiments, backplane 301 is used for dissipating heat, for example away from the one or more receivers.

FIG. 3A is a top view of backplane 301. FIG. 3B is an enlarged view of two heat spreaders on backplane 301, onto which a CPV receiver (not shown in this figure) may be coupled.

In some embodiments, backplane 301 is constructed as a metal core printed circuit board (MCPCB), comprising circuitry for collecting and routing electrical current. In some embodiments, backplane 301 comprises a plurality of layers of various functions and/or materials, for example as shown, for example, in FIG. 4.

In some embodiments, backplane 301 comprises electrical components 303 for processing the current, such as diodes, boosters, regulators, terminals and/or MPPT (maximum power point tracking) devices. In some embodiments, electrical components 303 are coupled to a substrate of backplane 301 by being soldered to the backplane substrate. Optionally, backplane 301 comprises one or soldering pads for attaching the electrical components. In some embodiments, electrical components 303 are coupled to a top surface of backplane 301 by adhesive means, for example using a material that is resistant to heat, such as silicon. In some embodiments, electrical components 303 are positioned away from high temperature "hot spots" in the backplane, for example directly under the receiver. In some embodiments, by being configured on backplane 301 as opposed to, for example, being configured on a receiver, electrical components 303 less exposed to direct sunlight and/or high temperature conditions which may exist on a surface of the receiver. Another potential advantage of electrical components 303 being configured on backplane 301 includes reducing a surface area of the receiver substrate. Optionally, this allows reducing costs, for example because the receiver substrate (e.g. ceramics) is more expensive than, for example the backplane substrate and/or the heat spreader material (e.g. metal).

In some embodiments, backplane 301 comprises electrical routing 305, such as cables and/or wires. In some embodiments, routing 305 interconnects between receivers that are coupled to the backplane. In some embodiment, routing 305 interconnects between electrical components 303. In some embodiments, routing 305 interconnects between receivers and electrical components 303. In some embodiments, routing (and/or wire tracing) 303 is buried within the backplane substrate material. In some embodiments, routing 303 includes a conductive foil, for example made of aluminum, copper, steel, and/or titanium. A potential advantage of the buried routing (e.g. buried wires and/or cables) includes reducing the exposure of routing 305 to direct sunlight and/or high temperature and/or ambient humidity and/or other conditions which may exist on top face 307 of backplane 301. Another potential advantage may include reducing and/or eliminating the need for external wiring, optionally reducing assembly time and/or costs. Optionally, a backplane with buried routing serves as a platform for assembling the receivers, for example by using a fully automated process.

Description of Heat Spreading Elements

In some embodiments, backplane 301 comprises one or more mounting locations on which one or more CPV receivers can be mounted. In some embodiments, backplane 301 is cooled by air from the surrounding environment, and does not include fins, or at least includes very short fins (for example shorter than 10 mm).

In some embodiments, one or more thermally conductive heat spreaders 309 are mounted on backplane 301. In some embodiments, heat spreaders 309 are shaped as sheets having a thickness ranging between 0.1-10 mm, such as 0.5 mm, 2 mm, 5 mm. In some embodiments, heat spreaders 309 are thick enough so as to dissipate heat from the receiver, for example in a funnel shaped flow pattern.

In some embodiments, a bottom face of heat spreaders 309 is coupled to backplane 301, for example soldered to backplane 301 through soldering pads, such as two soldering pads. In some embodiments, a top face of heat spreaders 309 is coupled to a receiver, for example by soldering. In some embodiments, heat spreaders 309 are designed and/or manufactured to comply with standard SMT requirements, and are suitable for assembly using SMT methods and/or machinery. Optionally, heat spreaders 309 are formed as a metal core printed circuit board.

In some embodiments, heat spreaders 309 are both electrically and thermally conductive, enabling heat dissipation from the receiver towards backplane 301, as well as conducting current from the receiver towards backplane 301. In some embodiments, heat spreaders 309 are made of copper and/or aluminum, due to their thermal and electrical conductivity properties.

In some embodiments, two heat spreaders 309 are configured between a receiver and backplane 301. Optionally, each heat spreader conducts a different potential from the receiver to the backplane. In some embodiments, to allow the separation of current, an isolating region such as gap 311 exists between adjacent heat spreaders. Optionally, a width of the gap ranges between 0.3-0.7 mm.

In some embodiments, a shape and/or size of heat spreaders 309 is determined according to shape and/or size of the receiver substrate, for example the surface of two adjacent heat spreaders is large enough to contain a bottom surface of the receiver. In some embodiments, a summed surface area of adjacent heat spreaders is larger than the bottom surface area of the receiver substrate, for example 30% larger, 50%, 75%, 100%, 200%, 1000% larger or intermediate, smaller, or higher values. In one example, the surface area of the receiver substrate is 156.25 mm^2, and a summed surface of two adjacent heat spreaders is 1225 mm^2, being 784% larger than the surface area of the receiver.

In an embodiment, a summed surface area of adjacent heat spreaders is similar to a bottom surface area of the receiver.

In some embodiments, a shape of the heat spreaders is designed to enable at least a portion of the heat to flow in a horizontal direction away from the receiver. In some embodiments, adjacent heat spreaders are configured as two rectangles which complete a square, having a larger edge than an edge of the receiver substrate to allow heat to flow horizontally. Optionally, a single square shaped heat spreader is used. In some embodiments, adjacent heat spreaders and/or a single heat spreader are formed as other geometrical structures such as a trapeze or a rectangle. In some embodiments, the heat spreaders may be non-planar, for example formed as a trapeze having a concave top surface, etc.

In some embodiments, a top face of heat spreaders 309 comprises a pad 313, for example for attaching the receiver to the heat spreader, for example by soldering. In some embodiments, two adjacent heat spreaders 309 comprise two rectangular pads, which may together complete a square pad. In some embodiments, pad 313 comprises one or more teeth 315, which are used for draining excessive solder paste and/or for causing the formation of solder fillets during soldering of the receiver onto heat spreaders 309.

In some embodiments, backplane 301 comprises a plurality of pads (not shown in this figure) through which, for example, two adjacent heat spreaders are soldered and/or mounted using adhesive means. Optionally, a CPV receiver is mounted directly on at least one pad, without heat spreaders. In some embodiments, a surface area of a backplane pad may range, for example, between 0.3-5 cm^2 for a square pad, for example a 1×1 cm pad. Various embodiments of pads comprise different shapes, such as a rectangle, a circle, half a circle, a trapeze, or any other shape suitable for mounting heat spreaders 309 and/or a receiver onto it. Optionally, the size and/or shape of a pad is determined according to a current generated by the solar cell.

A potential advantage of electrically conductive heat spreaders 309 includes dissipating heat as well as conducting current using a single element. Another potential advantage includes reducing or eliminating the need for external heat sinks, such as fins or pipes. Optionally, by not including external heat sinks, a total height of the complete module (for example including the backplane, heat spreaders, receiver and secondary lens) is reduced, for example a height of 28 mm. Optionally, a height of the same module without the lens is, for example, 5.5 mm. Optionally, a weight of the complete module is reduced. Optionally, by not including an external heat sink such as fins, costs and/or the number of required assembly processes are reduced. Optionally, the number of potential failure points is reduced (as connections are simple and robust), thereby potentially increasing the reliability of the module.

In some embodiments, a single heat spreader is configured between a receiver and backplane 301, for example as shown in FIG. 13. Optionally, the heat spreader functions only as thermal conductor for dissipating heat, and not as an electrical conductor, as this configuration does not allow the separation of current. In that case, electric terminals may be used for conducting current. Alternatively, the single heat spreader is used for one potential, whereas a different potential is coupled via wiring, for example from a top face of the solar cell to the backplane.

In some embodiments, backplane 301 acts as a heat dissipater, for example dissipating heat from heat spreaders 309 to the surrounding environment. Optionally, backplane 301 is thick enough to have a horizontal component of heat transfer in it. In some embodiments, the length and width dimensions of backplane 301 are determined during manufacturing such as to create a large surface area, for example on the top and bottom faces of backplane 301, to increase the heat dissipation. In some embodiments, the heat capacity of heat spreaders 309 and/or backplane 301 is greater than a heat capacity of the receiver, to increase the cooling rate of the receiver.

In some embodiments, the heat density measured, for example, at solar cell 103 ranges between 40-150 W/cm^2, the heat density measured at a surface of, for example, at the receiver substrate ranges between 15-40 W/cm^2, the heat density measured, for example, at a surface of the heat spreaders ranges between 1-6 W/cm^2, and the heat density measured, for example, at a surface of the backplane ranges between 0.05-1 W/cm^2 when assuming steady state conditions at each of the components.

In one example, for a ×1000 sunlight concentration ratio of the CPV receiver, the heat density at the solar cell is 21 W/0.3 cm^2, and the heat density at the heat spreaders is 21 W/12.6 cm^2.

In some embodiments, additional heat dissipation through radiation is achieved by a high emissivity layer on a surface of backplane 301 which is exposed to the environment, for example, as further explained in FIG. 4.

FIGS. 4A-D are a cross section of a backplane showing a four layer structure, according to some embodiments of the invention.

In some embodiments, backplane 301 comprises one or more layers of materials. In some embodiments, a material for each layer is determined according to a designated function of the layer, for example a layer for electrical conduction, a layer for thermal conduction, a layer for protecting against oxidation, etc. In some embodiments, the layers are arranged in the following order, from a top surface to a bottom surface: a thermally and electrically conductive layer 411, a dielectric layer 401, a thermally conductive base material layer 403, and a high emissivity layer 405. Optionally, a different order and/or various combinations of the described layers may be used.

In some embodiments, backplane 301 comprises a layer including one or more soldering pads 411, for mounting the CPV receiver and/or heat spreaders. In some embodiments, pads 411 are thermally and electrically conductive.

In some embodiments, backplane 301 comprises a dielectric layer 401, for electrically insulating between electrically conductive layer 411 which includes pads and traces, and a base material layer of the backplane, 403. In some embodiments, dielectric layer 401 is thermally conductive, to allow heat dissipation towards a bottom face of backplane 301. In some embodiments, dielectric layer 401 is made of thermally conductive, temperature resistant and/or UV stabile materials such as TCB-2, Cordierite, Forsterite, Spinel, Alumina, Ba Polytitanate. In some embodiments, a thickness of dielectric layer 401 ranges between 76-100 μm.

In some embodiments, base material layer 403 is made of a thermally conductive material, for example a material with thermal conductivity of at least 120 W/(mk). Some examples of materials include aluminum (such as aluminum alloy 5052), copper, and/or ceramics. Other materials may include stainless steel, zinc alloy, die cast iron, and/or glass. Optionally, the material is selected according to its durability, for example to withstand harsh environmental conditions. In some embodiments, a thickness of base material 403 ranges between 1.5-5 mm, for example 2, 3, 4.5 mm.

In some embodiments, for example as shown in FIGS. 4A and 4B, backplane 301 comprises a high emissivity layer 405. In some embodiments, high emissivity layer 405 covers at least a portion of a bottom face of backplane 301. Optionally, during positioning of the module, at least a portion of the bottom face is exposed to the environment to enable heat dissipation. In some embodiments, high emissivity layer 405 is made of materials such as black anodized aluminum. In some embodiments, a thickness of high emissivity layer 405 ranges between 10-100 μm. Optionally, the high emissivity layer increases the portion of the heat that is dissipated by radiation, for example 1%, 30%, 55% or intermediate or higher percentages of the heat. Optionally, layer 405 is air cooled, and heat is convected to the environment.

In some embodiments, for example as shown in FIGS. 4B and 4D, backplane 301 comprises a solder mask layer 407. In some embodiments, solder mask layer 407 is configured on a top face of backplane 301, for example in the intervals 409 (shown in FIGS. 4A and 4C) formed between heat spreaders 309. Optionally, at intervals 409, the material (such as copper) is etched, for example to provide electrical insulation. In some embodiments, solder mask layer 407 is highly reflective, for example to reflect rays of sunlight that hit a surface of the backplane surrounding the receivers. Optionally, this reduces the amount of heat absorbed by backplane 301. In some embodiments, solder mask layer 407 is made of, for example, epoxy based material such as PSR-4000 WTO3 CA-40 WT03. In some embodiments, a thickness of solder mask layer 407 ranges between 10-50 µm. Optionally, solder mask layer 407 reduces oxidation. Optionally, solder mask layer 407 prevents solder bridges from forming between components such as heat spreaders 309 during assembly.

In some embodiments, at least some portions of the backplane are plated with coating such as ENIG, HASL, or OSP coatings.

In some embodiments, a thickness and/or material of each of the layers comprising the backplane are selected such that each of the layers and/or interfaces between the layers will increase the thermal dissipation rate.

Description of an Exemplary CPV Receiver and Backplane

FIGS. 5A-B illustrate an exemplary photovoltaic receiver and backplane assembly, according to some embodiments of the invention. FIG. 5A is a top view of backplane 301 comprising one more receivers 101. FIG. 5B is an enlarged view of a receiver 101 coupled to heat spreaders 309 on backplane 301.

In some embodiments, a plurality of receivers 101 are configured on backplane 301 in a series and/or parallel manner and/or a combination thereof. Optionally, the array configuration is determined to create an optimal current capability, to increase the efficiency of the module. In some embodiments, the array configuration is determined according to a concentration ratio between the size of the lens and the size of the solar cell. In one example, a concentration ratio is ×1024 (for example using a 160×160 mm sized primary lens, not shown in this figure, and a 5×5 mm size cell). Optionally, the optimal array configuration in this case includes 9 receivers arranged on a 400×400 mm backplane, having a distance 501 between adjacent receivers of 160 mm.

In some embodiments, a bottom face of receiver 101 is soldered onto a top surface of heat spreaders 309, for example through a soldering pad. In some embodiments, receiver 101 is mounted onto a top surface of heat spreaders 309, for example using adhesive means such as electrically and/or thermally conductive epoxies, such as Ag fillers.

In some embodiments, a ratio between a weight of the receiver and backplane assembly (for example including a receiver with a solar cell mounted on top, a lens attached to the receiver using a lens holding frame, two heat spreaders positioned between the receiver and backplane, and a 160× 160 mm portion of the backplane, which is selected with respect to the active area of the primary lens) and the rated power ranges between 0.005-0.02 Kg/Watt. Optionally, the actual weight-power ratio is affected by the heat dissipation mechanism. Optionally, the mechanism described herein allows for a relatively small total assembly weight, in which a weight-power ratio at a certain concentration may be smaller than, for example, the weight-power ratio of a design which includes large external fins for dissipating heat.

In some embodiments, the module is positioned on one or more solar trackers. Optionally, the solar trackers maintain positioning of the module such that it is perpendicularly aligned with respect to the incoming sun rays, and/or so that the lens will focus sunlight onto the CPV receivers. A potential advantage of a backplane and receiver assembly having relatively small weight, for example in comparison to a module comprising large fins for heat dissipation, may include reducing the amount of load applied on the tracker.

An Exemplary Heat Dissipation Pattern of the Photovoltaic Module

FIG. 6A is a schematic illustration of a cross section of the module, showing an exemplary heat dissipation pattern through heat spreaders 309 and backplane 301, according to some embodiments of the invention.

In some embodiments, the module comprises one or more layers positioned between the bottom face of the solar cell and the environment, for example 2 layers, 3 layers, 4 layers. Optionally, the layers include receiver substrate 109, heat spreaders 309, and backplane 301, and heat dissipation is affected by the interfaces between these layers. In some embodiments, a surface area of each layer is larger than a surface area of the preceding layer, for example to create a funnel shaped heat flow pattern in which thermal energy flows vertically (for example along axis z) and/or horizontally (for example along axis x). Optionally, the heat flux density (per area) is reduced as the thermal energy is distributed across a larger surface area of each layer.

In some embodiments, at least a portion of the thermal energy 601 such as 10%, 20%, 50%, 90% or intermediate or lower values is convected from the top and/or side faces of heat spreaders 309, for example from a surface that is not covered by receiver substrate 109. In some embodiments, at least a portion of the thermal energy such as 40%, 60%, 90%, 75%, 20% or intermediate percentages is conducted by heat spreaders 309 sideways from the receiver. Optionally, heat is dissipated through at least some portions of the heat spreaders that are not in direct contact with the receiver substrate. Optionally, direct contact includes a soldered bonding, an adhesive bonding, or any other type of connection which physically engages both components together. In some embodiments, at least a portion of the thermal energy such as 20%, 45%, 70% or intermediate percentages is conducted downwards towards backplane 301.

In some embodiments, a thickness of each of the layers (e.g. thickness 607 of receiver substrate 109, thickness 605 of heat spreaders 309, thickness 603 of backplane 301) is determined so that heat flows in horizontal and/or vertical directions. Optionally, the heat dissipation is effective enough so that a temperature difference for example between a top surface of the receiver substrate and a bottom surface of the receiver substrate is reduced.

In some embodiments, a material of each layer is determined according to its thermal conductivity properties. In some embodiments, a thickness of each layer determined according to thermal conductivity properties of the material. Given the designated heat flow dissipation pattern, it is well known to perform a thermal simulation to determine a required thickness of one or more components, with respect to the thermal conductivity properties of the materials comprising them. For example, a higher thickness is selected for a material having low thermal conductivity, for example causing a larger portion of the heat to flow horizontally than flow vertically through the material, potentially increasing the horizontal component of the heat flow.

In some embodiments, the middle layer comprising heat spreaders 309 is thick enough to dissipate thermal energy 601 aside from receiver substrate 109, for example having a thickness 605 ranging between 0.1-10 mm, such as 0.5 mm, 2 mm, 5 mm. In some embodiments, a summed width 610 and/or length (this dimension is not shown in the figure) of adjacent heat spreaders 309 is large enough to conduct heat aside from receiver substrate 109, such as conduct at least 50%, 70%, 90% or intermediate, larger or smaller percentages of the heat aside from the receiver. In some embodiments, the summed width 610 and/or length of heat spreaders 309 is larger than a thickness 605 of the heat spreaders, for example by a factor or 2, 4, 7 or intermediate or higher factors, thereby optionally increasing the horizontal component of the heat flow.

In some embodiments, the middle layer comprising heat spreaders 309 is sized according to a size of lens 105, for example a longest edge of a heat spreader is longer than a largest diameter 609 of lens 105. Optionally, at least a portion of a surface area of heat spreaders 309 is not exposed to concentrated sunlight, if it is not positioned directly under lens 105. Optionally, a horizontal thermal gradient forms on a surface of heat spreaders 309. Optionally, at least a portion of the heat, for example 5%, 20%, 40% or intermediate percentages is dissipated from a top surface of heat spreaders 309.

In some embodiments, at least a portion of thermal energy 601 flows towards backplane 301. Optionally, there is a distribution of the thermal energy across a top face of backplane 301. In some embodiments, a bottom surface of backplane 301, facing the environment, comprises a high emissivity layer for increasing heat dissipation by radiation to the environment.

In some embodiments, the heat dissipation rate is high enough to maintain a temperature of the solar under a certain threshold, for example a threshold of 100° C., which may exist in harsh environmental conditions such as solar irradiance of 1000 W/m^2, an ambient temperature of 40° C., and a close to zero wind velocity. The threshold may be maintained even if no electricity is generated by the solar cell.

An exemplary density of the heat that may form at the solar cell 103 is about 0.84 W/mm^2. Assuming no heat dissipation from the top and side surfaces of the components (for example no heat dissipation due to radiation and/or convection), the density decreases to 0.13 W/mm^2 as heat is conducted onto a surface of the receiver substrate. Optionally, the density then decreases to 0.017 W/mm^2 as heat is conducted onto the middle layer comprising heat spreaders.

In some embodiments, a thickness of heat spreaders 309 and/or backplane 301 is selected to be thin enough, for example to decrease a distance between the receiver substrate and the environment, optionally increasing the dissipation rate, and yet thick enough for containing electrical components and/or buried routing and for being durable enough to withstand, for example, wind conditions.

Various embodiments may comprise other heat flow patterns, such as a parallel pattern.

The heat dissipation mechanism and/or heat dissipation structure described herein may be used with any type of a CPV receiver. In some embodiments, the heat dissipation mechanism and/or structure can be used with any heat source component in which a heat sink cannot be placed on a top surface, for example, of the component, and heat is dissipated through a bottom surface and/or any other surface. Some examples of pointed heat sources include optic components such as LED components, or RF components such as microwave components.

FIG. 6B shows exemplary results of a thermal analysis of a CPV receiver and backplane, according to some embodiments of the invention. As previously noted, heat may be dissipated through three interfaces, for example including an interface between a solar cell 611 and the receiver substrate 613, an interface between the receiver substrate 613 and heat spreaders 615, and an interface between heat spreaders 615 and backplane material 617.

Exemplary temperatures simulated at various locations of the module are shown in the figure, for example indicating a temperature difference of 12.08° C. between a temperature of the solar cell 611 and a temperature of backplane material 617. Optionally, thermal resistance properties of the components' materials affect the temperature gradient formed at the interfaces. Ideally, to achieve efficient heat dissipation, the materials are selected to have a high thermal conductance, thereby reducing a temperature gradient (assuming steady state conditions) which may form at the interfaces due to different thermal conductance properties of each of the materials.

FIG. 6C shows exemplary results of a thermal analysis of a cross section of the receiver and backplane module. The analysis shows a funnel shaped flow pattern, in which heat flows in vertical and horizontal directions away from the receiver. The temperatures simulated at various locations of the 3-layer structure decrease as the vertical and/or horizontal distance components from solar cell 619 towards backplane 621 increase.

As can be seen in the analysis, a temperature measured at a central location 625 under receiver substrate 623 on heat spreader 629 is, for example, 4.37° C. higher than a temperature measured at a horizontally distanced location 627 along heat spreader 629. Optionally, this temperature difference indicates the horizontal conduction of at least a portion of the thermal energy away from solar cell 619, which may be achieved by using a wide enough heat spreader.

The thermal simulations described herein were empirically verified by the inventors.

(The orange background has been added for clarification purposes to increase contrast—it does not indicate the ambient temperature surrounding the module).

An Exemplary Pad for Soldering a Receiver to a Backplane

FIGS. 7A-D describe a pad used for soldering a bottom face of receiver 101 (shown here without the lens) to a top face of one or more heat spreaders 309, according to some embodiments of the invention.

Figure 7A:
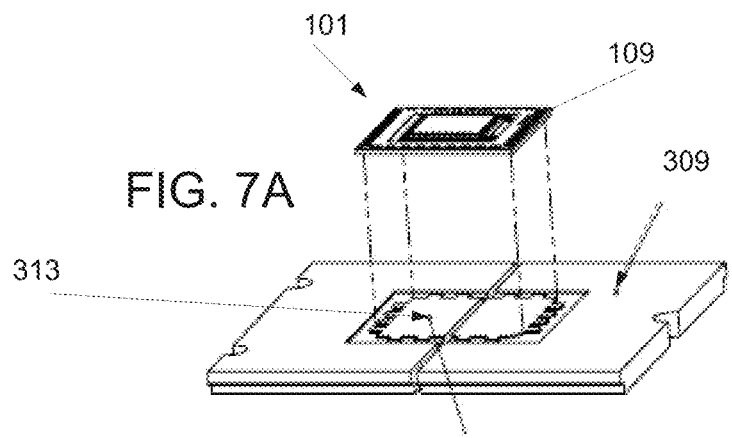

In some embodiments, for example as shown in FIG. 7A, pad 313 covers at least a portion of one or more heat spreaders 309. In some embodiments, two adjacent heat spreaders 309 comprise two completing halves of pad 313. In some embodiments, the external dimensions of pad 313 match the dimensions of a bottom pad of receiver 101. Optionally, each half of pad 313 is used for opposite polarities.

Figure 7B:
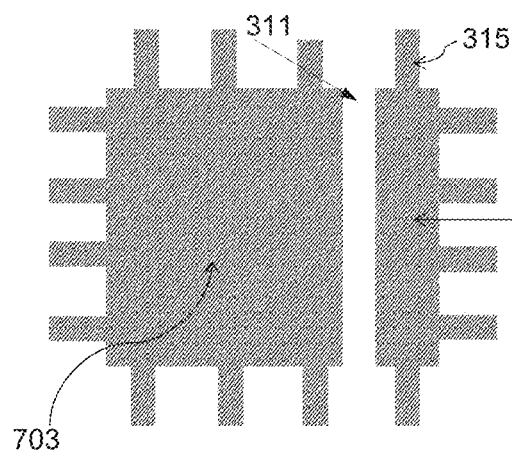

FIG. 7B shows a schematic illustration of pad 313. In some embodiments, a portion 701 of pad 313 is used for one polarity, and a second portion 703 is used for an opposite polarity. Optionally, portions 701 and 703 are configured each on a separate heat spreader 309. In some embodiments, as previously mentioned, a gap 311 is formed between portions 701 and 703, corresponding to the gap between adjacent heat spreaders, to prevent short circuiting. Optionally, the gap extends through a middle of completed pad 313, or, for example, as shown here, extends, for example, at a third of the length of pad 313. In some embodiments, gap 311 consists of air. Alternatively, gap 311 is filled with a dielectric material molding.

In some embodiments, pad 313 comprises teeth (or fingers) 315. Optionally, teeth 315 enable draining of excessive solder paste during soldering of receiver 101 to heat spreaders 309 (and thereby to backplane 301). Optionally, teeth 315 allow the formation of solder fillets.

Figure 7C:
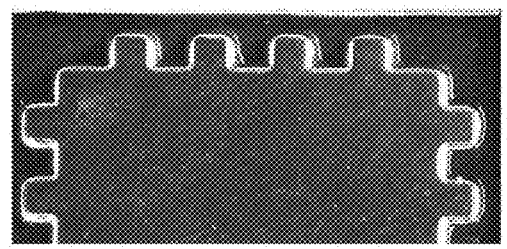
Figure 7D:
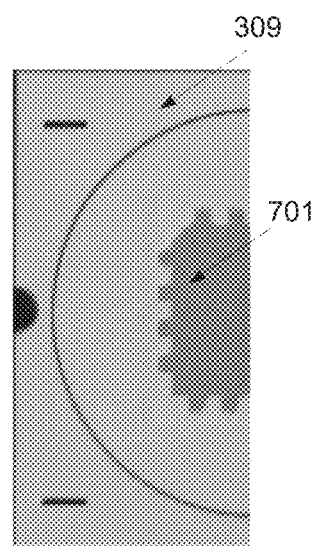

In some embodiments, a bordering area surrounding pad 313 is etched on a top face of heat spreader 309, for example using a chemical etching process and/or a laser etching process. In some embodiments, pad 313 is electro-plated, electro-less plated, printed and/or fabricated using other techniques. FIG. 7C is an image of a half of pad 313 on a copper heat spreader. FIG. 7D is an image of heat spreader 309. Portion 701 of pad 313 is configured at a central portion of heat spreader 309.

In some embodiments, a bonding formed between receiver 101 and heat spreaders 309 using pad 313 during soldering is thermally conductive. In some embodiments, the bonding is both thermally and electrically conductive. In some embodiments, the two portions of pad 313 are soldered each to its corresponding pad on the bottom face of the receiver, for example electrical pads 119 and 121 shown in FIG. 1.

In some embodiments, an arrangement of the teeth is optionally provided symmetrically around the pad. The pads' teeth not only lead excess solder away from the component/substrate interface, but also provide symmetrical surface tension forces helping to align the component on the pad, and/or preventing a misalignment of the component due to asymmetrical surface tension forces applied to the component while the solder is molten. Molten solder adheres to the component pad and to the substrate pad, and aligns the edge of the component with the edge of the pad.

A potential advantage of a bonding which is both electrically and thermally conductive may include eliminating the need for electric terminals, therefore allowing for smaller surface area, such as an area of receiver substrate 109. Another potential advantage of having a metallic interface between the components, such as a solder joint, includes improved thermal and/or electrical conductivity properties as compared to, for example, an adhesive bonding comprising a polymer interface.

An Exemplary Method for Assembling a CPV Receiver and Backplane Using a Double Reflow Process FIG. 8 is a flowchart of an exemplary method for soldering a photovoltaic module using a double reflow process, according to some embodiments of the invention.

In some embodiments, various components of the module are bonded by soldering. For example, the receiver substrate may be soldered to one or more heat spreaders, the heat spreaders may be soldered to the backplane, etc.

Different embodiments may include soldering methods incorporating one, two, and/or three reflow process. Optionally, a reflow process includes a process in which at least a portion of the assembly such as two adjoining surfaces is subjected to controlled heat, which may liquefy (e.g. melt) a soldering paste applied between the components to bond them, such as permanently bond them. In some embodiments, the process is performed using a reflow oven, for example an air reflow oven or a nitrogen reflow oven. In some embodiments, a double reflow process is used. A double reflow process is a process in which previously soldered components go through a second reflow process for soldering other one or more new components onto the originally soldered components, and the originally soldered bonding is not remelted. In some embodiments, each of the soldering processes is performed at different temperature conditions. Optionally, the temperature conditions are modified during the soldering process. Optionally, a user controls the reflow profile, for example the temperature conditions, during the process. In some embodiments, a different type of solder paste is used for each of the reflow processes, for example a solder paste used at the second reflow process may have a lower melting temperature than a solder paste used at the first reflow process.

In some embodiments, the method comprises soldering a solar cell to a receiver substrate (801). In some embodiments, the bonding formed between the solar cell and receiver substrate is electrically and/or thermally conductive. Optionally, the solar cell is soldered onto one or more designated soldering pads on a top face of the receiver substrate. In some embodiments, the footprint of the soldering pad is identical to a corresponding pad, for example configured on a bottom face of the solar cell. In some embodiments, the dimensions of a soldering pad are slightly larger than the dimensions of the corresponding component that is to be soldered onto the soldering pad, for example having an edge that is at least 0.01 mm longer than an edge of the component. Optionally, having larger dimensions facilitates the alignment of the component on the pad.

In some embodiments, the method comprises soldering a lens holding frame to the receiver substrate (803). Optionally, this step is performed during the first soldering process. Optionally, the receiver comprises a circumferential pad for soldering the lens holding frame. Optionally, a base of the lens comprises slots for receiving the walls of the frame. In some embodiments, each frame wall is soldered separately. In some embodiments, the frame walls comprise one piece and are soldered to the receiver substrate altogether. In some embodiments, the lens is connected by adhesive means, for example by mounting the lens on top of the receiver substrate with silicon sealing. In some embodiments, the lens is connected by mechanical means, such as fasteners or a snap-fit mechanism. In some embodiments, a lens frame holder is not used, and the lens is connected by adhesive bonding.

In some embodiments, the method comprises soldering one or more heat spreaders onto the backplane (805). Optionally, the heat spreaders are soldered onto a soldering pad, for example soldered on top of a plated copper layer of the backplane.

In some embodiments, to complete the assembly, the receiver (optionally including the lens holding frame and/or the lens) is soldered onto one or more, for example two, heat spreaders on the backplane (807). Optionally, a top face of the heat spreaders comprises a soldering pad, as previously shown. In some embodiments, during the soldering process, the receiver is self aligned, for example self aligned onto a center of the soldering pad, for example due to surface tension of the solder paste. In some embodiments, during this stage, components such as the receiver substrate comprising the previously soldered solar cell go through a second reflow process.

In some embodiments, components may be assembled in a different order than described above, for example, the receiver may be first soldered onto the heat spreaders, and only then the receiver and heat spreaders may be soldered onto the backplane.

In some embodiments, the second reflow profile is determined such as to prevent damage to the previously soldered solar cell and receiver, for example creation of voids, disengagement of the bonding, and/or creation of a thick intermetalic layer which may result in a weak interface. Optionally, this is done by using a different temperature range and/or a different type of solder paste, for example a solder paste having a lower melting point than the one used during the first reflow process. In some embodiments, the reflow profile is determined such as to prevent additional void content, by controlling, for example, the peak temperature, the heating rate, and/or the "time above liquidus" (TAL) stage. In one example, a void content of the interface between the receiver and heat spreaders (i.e. backplane) is less than 10% for a soldering area of 110-150 mm^2. Optionally, decreasing the void content reduces the thermal resistance of the bonding material, which may increase the heat dissipation rate. Additionally and/or alternatively, void content is reduced by plating surfaces of both soldered interfaces, using specific stencil designs, and/or selecting components for soldering according to their geometry. Various parameters may have an effect on the void content, and can be selected such as to reduce void content, for example including the type of solder paste, the amount of solder paste, a surface of the soldered components, reflow profile such as temperature profile and/or duration, and reflow conditions for example including the use of a nitrogen reflow oven, a vacuum reflow oven, etc.

In some embodiments, the reflow profile, for example the temperature profile, duration of the process, the type of solder paste used and/or any other parameters are determined such as to prevent splashing of flux. In some embodiments, the reflow profile is optimized so that the bonding between the receiver and the heat spreaders (backplane) and/or the bonding between the heat spreaders and the backplane can withstand strong shear stress.

In some embodiments, multiple solder pastes having various metal contents and/or various melting temperatures are used. In some embodiments, the solar cell is soldered onto the receiver using one type of solder paste, and the completed receiver is soldered onto the heat spreaders using a second type of solder paste. In some embodiments, the same solder paste is used for both soldering processes, and melting of the original solder bonding may be prevented by shortening a duration of the process. Exemplary soldering pastes include compounds such as SnAgCu, AuSn, Sn/Pb, Bi/Sn, Bi/Sn/Ag and/or combinations of them.

In some embodiments, a flux is used as a reducing agent for preventing oxidation of the surfaces during soldering, and/or dissolving oxides on the metal surface. Optionally, the solder paste comprises flux. Optionally, the flux facilitates wetting the surfaces with the solder paste. In some embodiments, the flux is water soluble, and can be removed by cleaning the soldered components using a water based, heat based, ultrasonic, and/or high pressure cleaning process. In some embodiments, the flux is a non-clean type, as its residue is non-conductive and non-corrosive, therefore its removal is not required. In some embodiments, the flux is removed using a solvent based cleaner. Alternatively, soldering is performed without using flux.

A potential advantage of a solder paste bonding includes having a durable bonding, for example in comparison to polymer based adhesive bonding. Another potential advantage includes having a thermally and electrically conductive bonding, decreasing the need for wires or other connectors. Optionally, by having a small number of connections between components, the potential number of points of failure of the model decreases.

In some embodiments, the components self align during soldering, for example due to surface tension of the solder paste that may be affected by solder paste drainage occurring at the pad's teeth. For example the receiver may self align onto a center and/or edge of the connecting pad on top of the heat spreaders.

In some embodiments, bonding between the receiver and heat spreaders and/or bonding between the heat spreaders and backplane is formed by using a thermally and electrically conductive adhesive.

Various embodiments may comprise bonding formed using a reflow process and/or bonding formed by using an adhesive. In one example, the heat spreaders are attached to the backplane using a thermally and electrically conductive adhesive, and the receiver is soldered onto the heat spreaders using a reflow process. Other embodiments may comprise any other combinations of components that are bonded using a reflow process and/or components that are bonded using an adhesive.

An Exemplary Manufacturing Method

FIGS. 9A-B are flowcharts of an exemplary manufacturing process of a receiver and backplane module, according to some embodiments of the invention.

In some embodiments, the module and/or components of it such as the receiver and/or backplane are assembled in an automated process. Optionally, the process is a fully automated process.

A potential advantage of the automated process includes high repeatability, high reliability, and a small assembly tolerance. In one example, a linear assembly accuracy includes, for example, a pad tolerance of ±10 μm between the solar cell and receiver substrate, a pad tolerance of ±10-30 μm between the frame and the substrate, a pad tolerance of ±50-100 μm between the heat spreaders and the backplane. Optionally, an assembly tolerance of the receiver substrate onto the heat spreaders may depend on assembly tolerances of previously assembled components, such as the solar cell and the receiver substrate. In some embodiments, ideally, the pad tolerance between the receiver substrate heat spreaders ranges between ±20-30 μm.

Optionally, the exemplary tolerances mentioned above are achieved due to the self aligning of components.

In some embodiments, standard surface-mount technologies (SMT) and/or common microelectronic assembly processes are used for production and/or assembly. Some examples of the processes include screen printing, die bonding, wire bonding, pick and place assembly, soldering, and/or visually inspecting the components.

Optionally, using the technologies described herein allows maintaining relatively low production costs. Optionally, using the above described technologies provides a reliable output. Optionally, using the above technologies allows for production scale up. Optionally, relatively high assembly accuracy is achieved by using the above technologies, which is important in an optical system such as the CPV module.

In some embodiments, the assembly process supports fine pitch designs of the backplane and/or the receiver.

FIG. 9A describes an exemplary procedure for assembling the receiver:

Printing of solder paste on receiver substrate (901), for example using a screen printing process.

Placing the solar cell and optionally lens holding frame on the receiver substrate (903), for example using pick and place machinery.

Soldering the solar cell to the receiver substrate (905), for example using a reflow oven. Optionally, the reflow profile is optimized to reduce the void content of the bonding. Optionally, the reflow soldering is performed under vacuum conditions.

Optionally, the reflow soldering is performed using a vapor phase reflow oven.

Removing flux from the assembly components (907), for example using water based cleaning, solvent based cleaning, and/or semi water cleaning.

Optionally performing a plasma cleaning process (909), for example to remove impurities and/or contaminates, possibly strengthening the wire bonding and/or other connection between other components such as the busbars.

Optionally adding one or more wire connections (911) to the receiver (wire bonding process).

Optionally separating a panel of multiple receiver substrates. (913).

Encapsulating the solar cell on the receiver substrate, and attaching the lens (915).

Optionally curing the bonding and encapsulation materials (917).

Electrically testing the receiver (919), and sorting according to the performance.

FIG. 9B describes an exemplary procedure for assembling a backplane.

Optionally, at least some stages of this procedure are performed in parallel and/or following the above described procedure:

Printing of solder paste on backplane substrate (921), for example using a screen printing process.

Placing components such as heat spreaders, bypass diodes, blocking diodes, connectors and/or other components onto the backplane, for example using pick and place machinery (923).

Soldering the components onto the backplane, for example using a Nitrogen reflow oven (925).

Printing solder paste onto the heat spreaders. Optionally, the solder paste has a relatively low melting point (927).

Placing a receiver (comprising receiver substrate, a solar cell and an assembled lens) on top of the heat spreaders, for example using pick and place machinery (929).

Soldering a receiver (comprising receiver substrate, a solar cell and an assembled lens) onto the heat spreaders, for example using a Nitrogen reflow oven (931).

Performing visual inspection and quality control (933).

Packaging (935).

In some embodiments, one or more components of the module are shaped and/or sized to fit in standard SMT packaging configurations, such as a tape and reel format or tray packaging.

In some embodiments, a component such as the receiver substrate (for example with the solar cell and optionally the lens holding frame soldered onto it) is manufactured in a panel format comprising multiple receivers. Optionally, the receivers are separated by cutting and/or breaking the panel along the edges of the receivers. In some embodiments, the lenses are connected to the receivers after the panel separation.

In some embodiments, the module and/or some of its components are suitable for mass production. In some embodiments, the materials and/or methods used are ROHS-compliant.

In some embodiments, electrical interconnections on the backplane can be easily re-routed, without affecting the receiver structure.

In some embodiments, bonding between the connecting pads of, for example, two components via soldering allows for a high assembly precision level.

Various Embodiments of Receivers and/or Backplanes

FIGS. 10A-C illustrate a receiver, for example the receiver described in FIG. 1, and a corresponding backplane and receiver assembly, according to some embodiments of the invention. In some embodiments, for example as shown in FIG. 10A, receiver 1001 comprises a lens 1003. Optionally, lens 1003 comprises pedestals 1005 for its positioning on receiver substrate 1007. In some embodiments, for example as shown in FIG. 10B, one or more receivers are arranged in an array on backplane 1009. Optionally, the receiver is attached to heat spreaders 1011, for example soldered. FIG. 10C is an enlarged view of a receiver 1001 configured on top of heat spreaders 1011, which are attached to backplane 1009. Optionally, receiver substrate 1007 is thick and/or wide enough for spreading heat from the solar cell, for example having a surface area that is 400% larger than an area of the solar cell.

FIGS. 11A-C illustrate a receiver comprising a lens holding frame, and a corresponding backplane and receiver assembly, according to some embodiments of the invention. In some embodiments, for example as shown in FIG. 11A, a lens holding frame 1101 is attached to a plated copper layer which is electroplated on a top surface of receiver substrate 1103. Optionally, frame 1101 is soldered onto a designated circumferential soldering pad. In some embodiments, lens 1105 comprises one or more slots, in which at least a portion of the walls of frame 1101 is inserted. Alternatively, lens 1105 does not comprise slots.

In some embodiments, frame 1101 holds lens 1105 in place. Optionally, the lens is sealed onto the frame to strengthen the attachment and/or protect the solar cell, for example, from environmental effects. Optionally, the lens is sealed onto the frame for example using silicon adhesives and/or encapsulating materials. Since the frame holds the lens, less sealing material can be used. In some embodiments, the lens holding frame is sized according to the largest diameter of lens 1105. A potential advantage of using lens holding frame 1101 to guide and hold the lens in position includes reducing an area required for lens bonding, for example optionally eliminating the need for a pedestal. Optionally, the bonding between the lens and the frame walls is formed vertically (as opposed to, for example, horizontally along a bottom face of the lens base), which may increase the resistance to shear forces. Optionally, the lens holding frame is attached to the lens prior to soldering of the frame onto the receiver substrate. Optionally, in that case, the lens can be considered as a solderable standard SMT component.

FIG. 11B shows a plurality of receivers positioned on a backplane, for example positioned on top of heat spreaders. In some embodiments, for example as shown on FIG. 11B, the surface area of the heat spreaders is similar to the surface area of the receiver substrate that is positioned on top of them. Other embodiments may include heat spreaders with a larger surface area than that of the receiver, for example 20%, 30%, 60%, 100%, 700%, 1000% larger. FIG. 11C is an enlarged view of the receiver comprising a lens holding frame positioned on a backplane.

FIGS. 12 A-C illustrate another embodiment of a receiver comprising a lens holding frame. In some embodiments, for example as shown in FIG. 12A, lens 1201 is configured on top of lens holding frame 1203, for example using one or more slots at a base of lens 1201 in which the frame walls are inserted. Optionally, frame 1203 is sized according to a size of receiver substrate 1205. Optionally, the walls of frame 1203 are inclined towards a center of the receiver so that they apply opposing force to the lens walls to affirm the lens in position, while being flexible enough to withstand various manufacturing tolerances of the lens base.

Embodiment of a Heat Spreader

FIGS. 13A-B illustrate an embodiment of a heat spreader 1301. In some embodiments, a receiver is attached to a single heat spreader 1301, for example soldered on top of soldering pad 1303. In some embodiments, if heat spreader 1301 is made of an electrically conductive material, it may be used to conduct from the receiver towards backplane 1205, and electric terminal and/or wires bypassing heat spreader 1301 may be used for conducting different potentials. Alternatively, heat spreader 1301 is used only for dissipating heat from the receiver, and current is conducted through terminals and/or designated wiring. In some embodiments, a surface area of spreader 1301 is larger than a bottom surface area of the receiver, for example 20%, 50%, 75%, 100%, 200%, 800%, 1000% larger, or intermediate, higher or smaller values. In some embodiments, the surface area of heat spreader 1301 is similar to a bottom surface area of the receiver.

Embodiment of a Receiver Mounted Directly on a Backplane

FIGS. 14A-B illustrate an embodiment of a receiver 1401 (shown in this figure including lens 1403, and a lens holding frame 1407) mounted directly on backplane 1405. FIG. 14A is a side view of receiver 1401 configured on backplane 1405, and FIG. 14B is a front view of the receiver on the backplane. In some embodiments, receiver 1401 is mounted directly on top of backplane 1405, for example by soldering a bottom surface of the receiver substrate directly onto the backplane material. Optionally, in this configuration, backplane 1405 comprises a layer of thermally and optionally electrically conductive material, such as aluminum and/or copper, which may cover a top surface of backplane 1405. Optionally, the layer is thick enough for dissipating heat from receiver 1401. Optionally, a top surface of backplane 1405 comprises a connecting pad which receiver 1401 may be soldered to and/or attached to using an adhesive.

It is expected that during the life of a patent maturing from this application many relevant photovoltaic modules will be developed and the scope of the term photovoltaic module is intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

What is claimed is:

1. A CPV receiver and a backplane assembly comprising:
    a backplane;
    at least two CPV receivers mounted onto said backplane, each including a substrate; and
    each of said at least two CPV receivers has its own separate thermally conductive heat spreader assembly comprising at least two spaced apart heat spreaders, wherein said heat spreader assembly is positioned between said substrate of a CPV receiver and said backplane;
    wherein said heat spreader assembly for a first CPV receiver of said at least two CPV receivers is spaced apart from all the heat spreader assemblies of all the other CPV receivers of said at least two CPV receivers;
    wherein for each of said CPV receivers, the summed surface area of said heat spreader assembly is between 2 to 10 times larger than a bottom surface area of said substrate of said CPV receiver;
    wherein said heat spreader assembly is sized to contact a part of said substrate of each said CPV receiver, for dissipating at least 50% of the thermal energy conducted from said CPV receiver substrate part towards a portion of the heat spreader assembly which is not directly in contact with said CPV receiver substrate part, and wherein said heat spreader assembly is thermally and electrically connected to said backplane;
    wherein said backplane comprises at least one pad for mounting at least one of said heat spreaders and each of said at least two CPV receivers onto said backplane;
    wherein said pad is thermally and electrically conductive, providing at least two electrical contacts; and wherein a size of said pad is at least 1 cm×1 cm.

2. The assembly according to claim 1, wherein said heat spreader assembly comprises at least two planar surfaces mounted to a surface of said backplane.

3. The assembly according to claim 1, wherein a thickness of said heat spreader assembly is between be 0.1-10 mm.

4. The assembly according to claim 1, comprising at least three soldered interfaces for spreading and dissipating said thermal energy, including
    an interface between a solar cell and said substrate of one of said CPV receivers;

an interface between said substrate of said CPV receiver and said heat spreader assembly; and an interface between said heat spreaders and said backplane.

5. The assembly according to claim 1, wherein heat dissipation of the at least two CPV receivers and backplane assembly is configured for maintaining an operating temperature of a solar cell forming part of one of said at least two CPV receivers below 100° C. when the ambient temperature is 40° C., wind velocity is 0 m/s, incoming solar irradiance is 1000 W/m^2, and the sunlight concentration is ×1000.

6. The assembly according to claim 1, wherein said backplane is constructed as a metal core printed circuit board (MCPCB).

7. The assembly according to claim 1, wherein said heat spreader assembly is constructed as a metal core printed circuit board (MCPCB).

8. The assembly according to claim 1, wherein said heat spreader assembly is a surface mount component suitable for mounting using SMT (surface mount technology).

9. The assembly according to claim 1, wherein said backplane comprises a substrate suitable for surface mount technology machinery use.

10. The assembly according to claim 1, wherein said backplane includes one or more pads for mounting electronic components.

11. The assembly according to claim 1, wherein a linear assembly tolerance is smaller than 0.15 mm.

12. The assembly according to claim 1, wherein at least some of said thermal energy is conducted from each of said at least two CPV receivers through a plurality of heat conducting layers, wherein a layer further away from each of said at least two CPV receivers has a larger surface area and reduced heat flux relative to a layer closer to said CPV receiver.

13. The assembly according to claim 12, where at least some of said thermal energy and at least some of an electrical current from a solar cell mounted on each of said at least two CPV receivers are conducted together through said plurality of layers.

14. The assembly according to claim 1, wherein said backplane comprises electrical routing electrically connected to an anode and a cathode of a solar cell mounted on each of said at least two CPV receivers.

15. The assembly according to claim 1, wherein said heat spreader assembly is electrically conductive for conducting current from each of said at least two CPV receivers to said backplane.

16. The assembly according to claim 12, wherein each of said at least two CPV receivers is soldered to said heat conducting layers and wherein said heat conducting layers are soldered to each other.

* * * * *